(12) United States Patent
Otake et al.

(10) Patent No.: US 7,733,092 B2
(45) Date of Patent: Jun. 8, 2010

(54) MAGNETIC FIELD COIL AND MAGNETIC RESONANCE IMAGING APPARATUS

(75) Inventors: Yosuke Otake, Hachioji (JP); Yoshihisa Soutome, Tokyo (JP); Koji Hirata, Saitama (JP); Yoshitaka Bito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 167 days.

(21) Appl. No.: 12/018,287

(22) Filed: Jan. 23, 2008

(65) Prior Publication Data

US 2008/0297154 A1  Dec. 4, 2008

(30) Foreign Application Priority Data

May 31, 2007 (JP) ............... 2007-145029

(51) Int. Cl.
*G01V 3/00* (2006.01)
(52) U.S. Cl. ...................... 324/322; 324/318
(58) Field of Classification Search .................. 324/322, 324/318

See application file for complete search history.

(56) References Cited

U.S. PATENT DOCUMENTS

| | | | |
|---|---|---|---|
| 5,038,105 A | * | 8/1991 | Codrington et al. ......... 324/318 |
| 6,198,288 B1 | * | 3/2001 | Gauss et al. ................. 324/322 |
| 6,794,874 B2 | * | 9/2004 | Hasegawa .................... 324/322 |
| 6,906,520 B2 | * | 6/2005 | Heid et al. ................... 324/322 |
| 6,933,725 B2 | * | 8/2005 | Lim et al. .................... 324/322 |
| 2007/0285096 A1 | | 12/2007 | Soutome et al. |

OTHER PUBLICATIONS

M. D. Schnall et al., "A New Double-Tuned Probe for Concurrent $^1$H and $^{31}$P NMR", Journal of Magnetic Resonance, USA, 1985, 65, pp. 122-129.

Peter M. Joseph et al., "A Technique for Double Resonant Operation of Birdcage Imaging Coils", IEEE Transactions on Medical Imaging, 1989, 8, pp. 286-294.

* cited by examiner

*Primary Examiner*—Louis M Arana
(74) *Attorney, Agent, or Firm*—Antonelli, Terry, Stout & Kraus, LLP.

(57) ABSTRACT

Provided is an RF coil which can highly efficiently and uniformly irradiate a RF magnetic field having two or more magnetic resonance frequencies close to each other, and receive magnetic resonance signals of two or more magnetic resonance frequencies close to each other with high sensitivity and uniform sensitivity profile in an MRI apparatus. Two or more frequencies to which the coil is tuned are adjusted so as to be between resonance frequencies of series resonant circuits constituting the RF coil.

17 Claims, 21 Drawing Sheets signal processing circuit

500

501

502

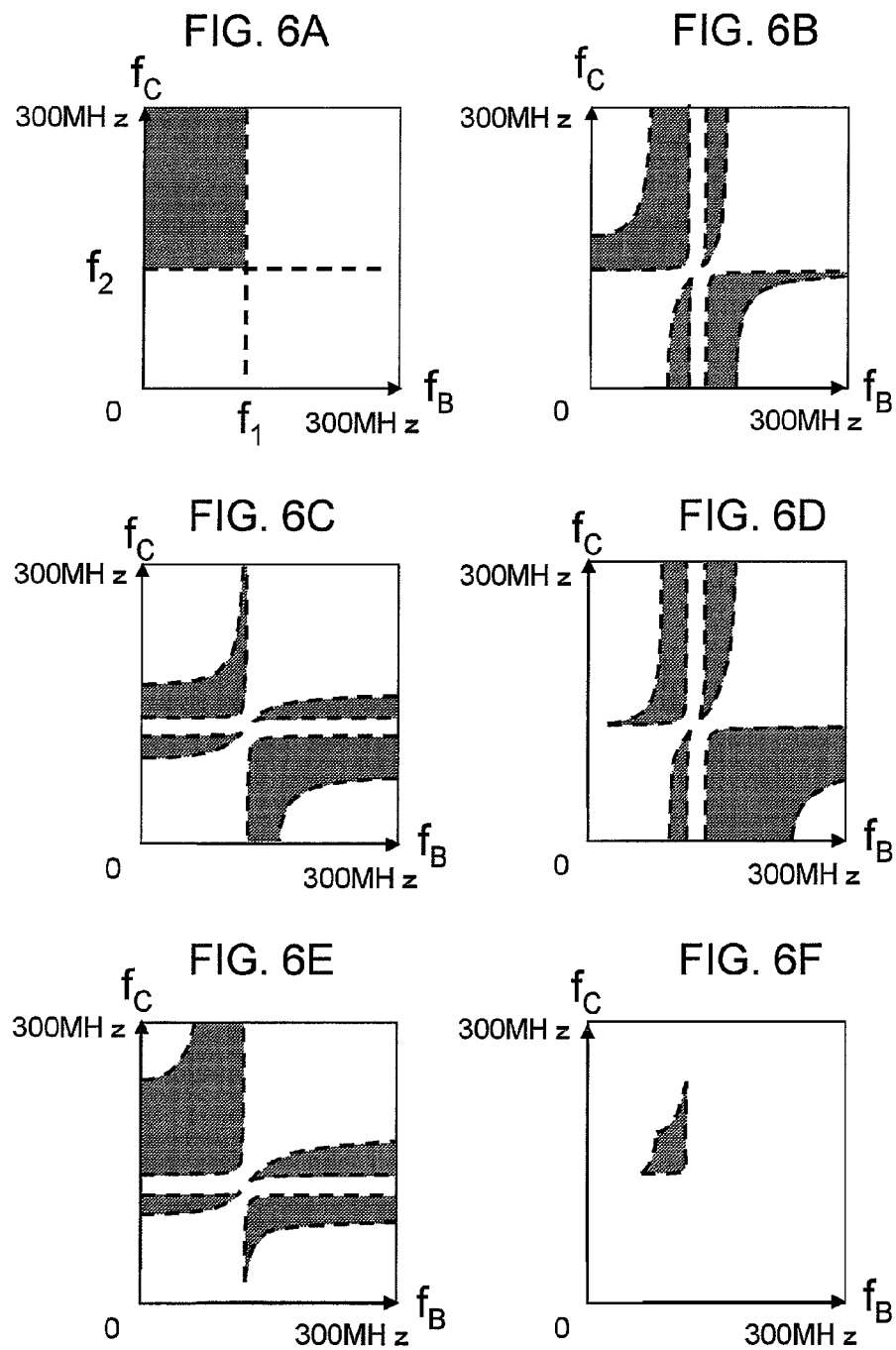

600

601

602

603

¹H    ¹⁹F

MAGNETIC FIELD COIL AND MAGNETIC RESONANCE IMAGING APPARATUS

CLAIM OF PRIORITY

The present application claims priority from Japanese application JP 2007-145029 filed on May 31, 2007, the content of which is hereby incorporated by reference into this application.

BACKGROUND OF THE INVENTION

The present invention relates to a magnetic resonance imaging (MRI) apparatus, and more particularly to a RF (radio-frequency) coil for detecting nuclear magnetic resonance images of two or more kinds of nuclides.

MRI apparatuses are diagnostic imaging apparatuses for medical use, which induce magnetic resonance of atomic nuclei in arbitrary sections crossing a subject and obtain tomograms of the sections from generated magnetic resonance signals. As the magnetic resonance signals, those of hydrogen nuclei ($^1$H) are generally used.

MRS (magnetic resonance spectroscopy) and MRSI (magnetic resonance spectroscopic imaging), which are types of magnetic resonance imaging methods, are used as methods for measuring metabolic conditions in the living bodies. Here, MRS is a method of measuring frequency distribution of magnetic resonance signals emitted by a substance, and MRSI is a method of imaging on the basis of certain specific frequency components of magnetic resonance signals having frequency distribution. In these imaging methods, in addition to the imaging based on magnetic resonance signals of hydrogen nuclei ($^1$H), magnetic resonance signals of atomic nuclei other than those of hydrogen such as those of fluorine ($^{19}$F), phosphorus ($^{31}$P), sodium ($^{23}$Na) and carbon ($^{13}$C) are also imaged. In order to simultaneously obtain images from magnetic resonance signals of two kinds of different atomic nuclei, the RF coil for irradiating a RF magnetic field for exciting the atomic nuclei and detecting the magnetic resonance signals is required to be tuned to the frequencies of the magnetic resonance signals of the two kinds of atomic nuclei (magnetic resonance frequencies). Such a coil is called double-tuned RF coil.

As conventional double-tuned RF coils, there are those comprising a trap circuit having a capacitor and an inductor connected in parallel and inserted into a loop of a coil, as shown in FIG. 20 (see, for example, Japanese Patent Unexamined Publication (Kokai) No. 6-242202 and M. D. Schnall et al., "A New Double-Tuned Probe for Concurrent $^1$H and $^{31}$P NMR", Journal of Magnetic Resonance, USA, 1985, 65, pp. 122-129). These double-tuned RF coils are intended to be tuned to two kinds of frequencies of magnetic resonance signals which are significantly differ from each other, for example, those of $^1$H and $^{31}$P, and they are not intended to be used for a case where frequencies to which they are tuned are close to each other. In order to realize double-tuning in these double-tuned RF coils to two kinds of frequencies close to each other, the inductor and capacitor used for the trap circuit must have an inductance of 10 nH or lower and a capacitance of several hundreds pF or higher, respectively. Since it is difficult to manufacture inductors having a small inductance, and such inductors also scarcely allow adjustable range, they are impractical. Furthermore, in capacitors having a large capacitance, it becomes impossible to ignore RF loss of the devices themselves at a frequency of 1 MHz or higher, and there is caused degradation of the receiving sensitivity and transmission efficiency of the RF coils.

As double-tuned RF coils used for a case where two kinds of magnetic resonance frequencies are close to each other, there are double-tuned saddle-type RF coils in which two saddle-type RF coils that resonate at each frequency are perpendicularly disposed (refer to FIG. 21.) and double-tuned RF coils in which capacitor of a birdcage RF coil is partially changed so that the coil should resonate at each frequency (see, for example, Peter M. Joseph et al., "A Technique for Double Resonant Operation of Birdcage Imaging Coils", IEEE Transactions on Medical Imaging, 1989, 8, pp. 286-294).

SUMMARY OF THE INVENTION

Since sensitivity profiles of the double-tuned saddle-type RF coils and double-tuned birdcage RF coils corresponding to two kinds of magnetic resonance signals significantly differ from each other, the region providing favorable sensitivities for both kinds of the signals is limited. Moreover, the QD (quadrature detection) system which improves the sensitivity 1.4 times cannot be employed in these double-tuned RF coils, and therefore sufficient sensitivity cannot be obtained.

The present invention was accomplished in view of the aforementioned situation, and an object of the present invention is to provide a technique for RF coils of MRI apparatuses to highly efficiently and uniformly irradiate a RF magnetic field having two or more magnetic resonance frequencies close to each other and receive magnetic resonance signals of these frequencies with high sensitivity and uniform sensitivity profile.

The RF coil for MRI apparatus of the present invention is characterized in that the two or more kinds of frequencies to which the coil is tuned are adjusted to be between the resonance frequencies of two or more series resonant circuits constituting the RF coil.

Specifically, there is provided a RF coil for magnetic resonance imaging apparatus comprising a first series resonant circuit comprising a loop coil made of a conductive material and one or more capacitors inserted into the loop coil, a first circuit connected in parallel to the first series resonant circuit, and a signal processing circuit connected in parallel to the first circuit, wherein the first circuit comprises a capacitor and an inductor, and is connected in parallel with two or more series resonant circuits each having different resonance frequencies, the resonance frequencies of the series resonant circuits also differ from resonance frequency of the first series resonant circuit, and the resonance frequencies of the magnetic field transmit and receive RF coil are adjusted so as to be between the resonance frequency of the first series resonant circuit and the resonance frequencies of the series resonant circuits. Here, the first circuit is a circuit connected in parallel to the first series resonant circuit and comprising series resonant circuits connected in parallel. Moreover, it comprises two or more series resonant circuits of different resonance frequencies comprising one or more capacitors and one or more inductors and connected in parallel, and the resonance frequencies of the series resonant circuits also differ from the resonance frequency of the first series resonant circuit.

According to the present invention, in an MRI apparatus, the RF coil can highly efficiently and uniformly irradiate a RF magnetic field having two or more magnetic resonance frequencies close to each other, and receive magnetic resonance signals of these frequencies with high sensitivity and uniform sensitivity profile.

BRIEF DESCRIPTION OF THE DIAGRAMS

FIG. 6A, FIG. 6B, FIG. 6C FIG. 6D, FIG. 6E and FIG. 6F are diagrams for explaining the method for determining the resonance frequencies $f_B$ and $f_C$ in the first embodiment.

Figure 7:
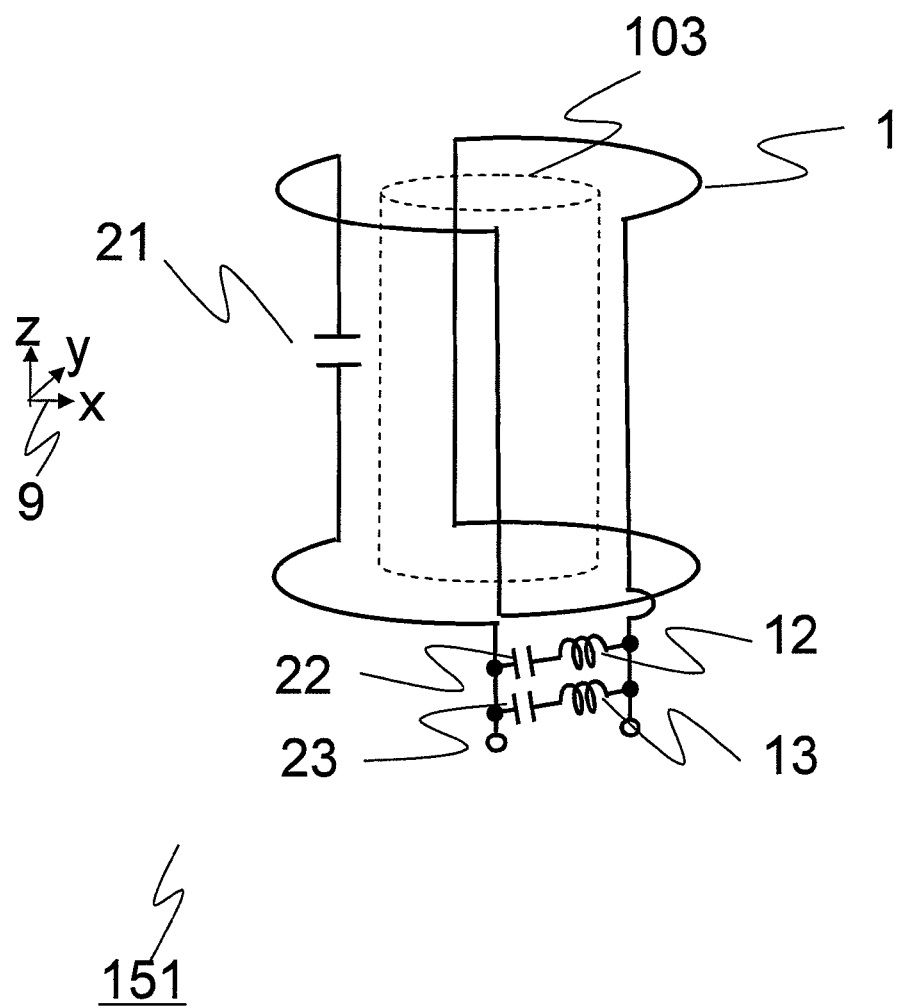

FIG. 7 is a circuit diagram of the double-tuned saddle-type coil of the first embodiment.

Figure 8:
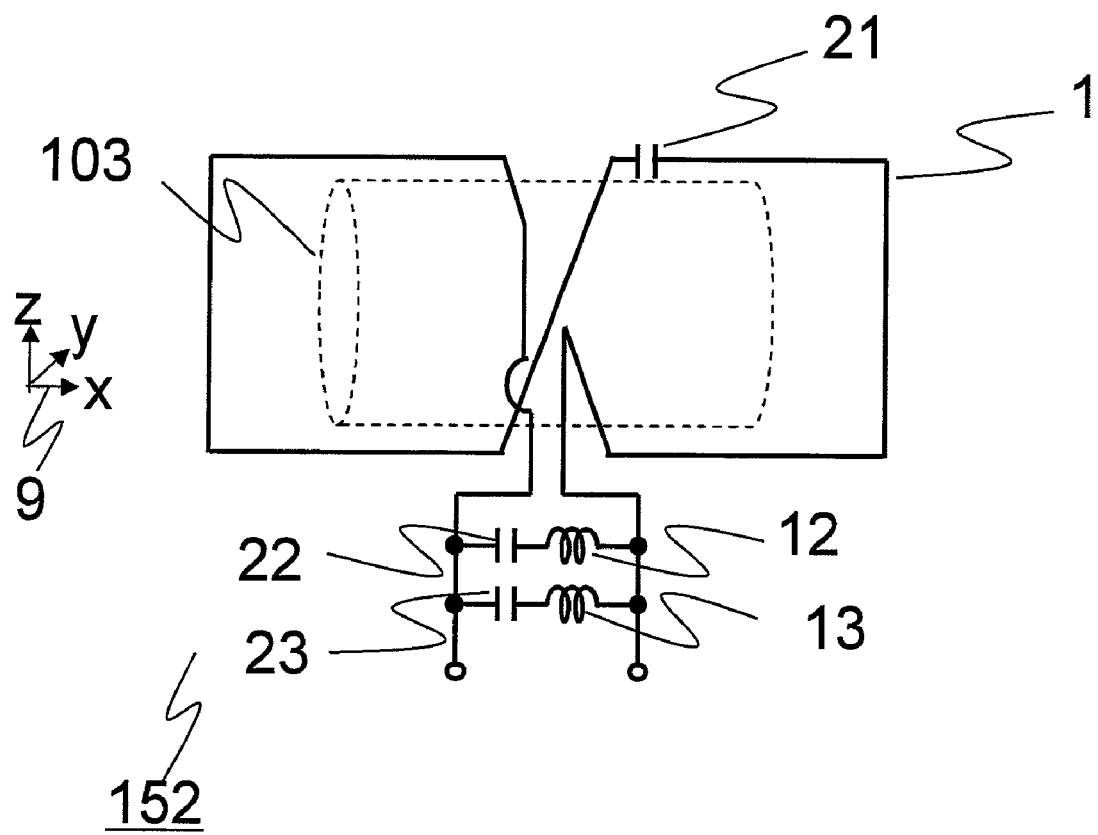

FIG. 8 is a circuit diagram of the double-tuned butterfly-type coil of the first embodiment.

Figure 9:
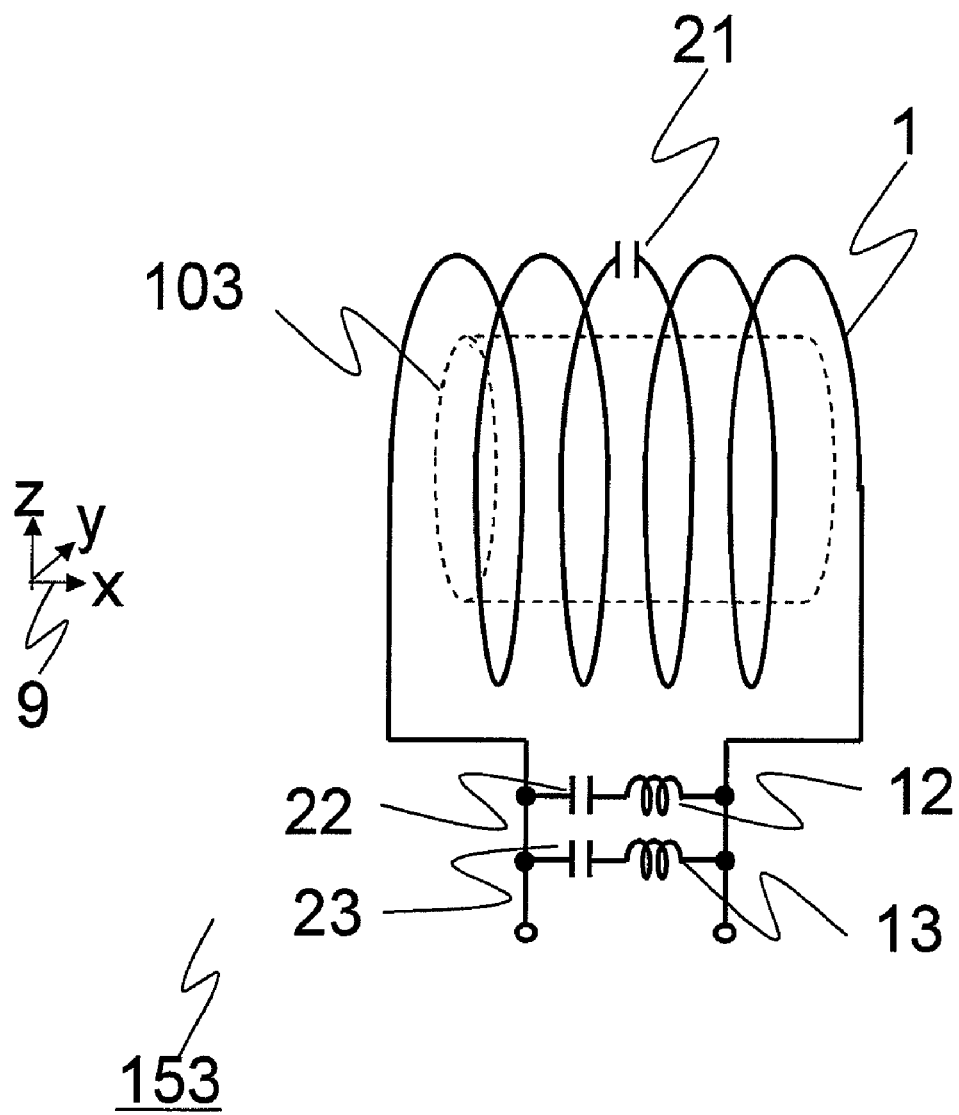

FIG. 9 is a circuit diagram of the double-tuned solenoid-type coil of the first embodiment.

Figure 10:
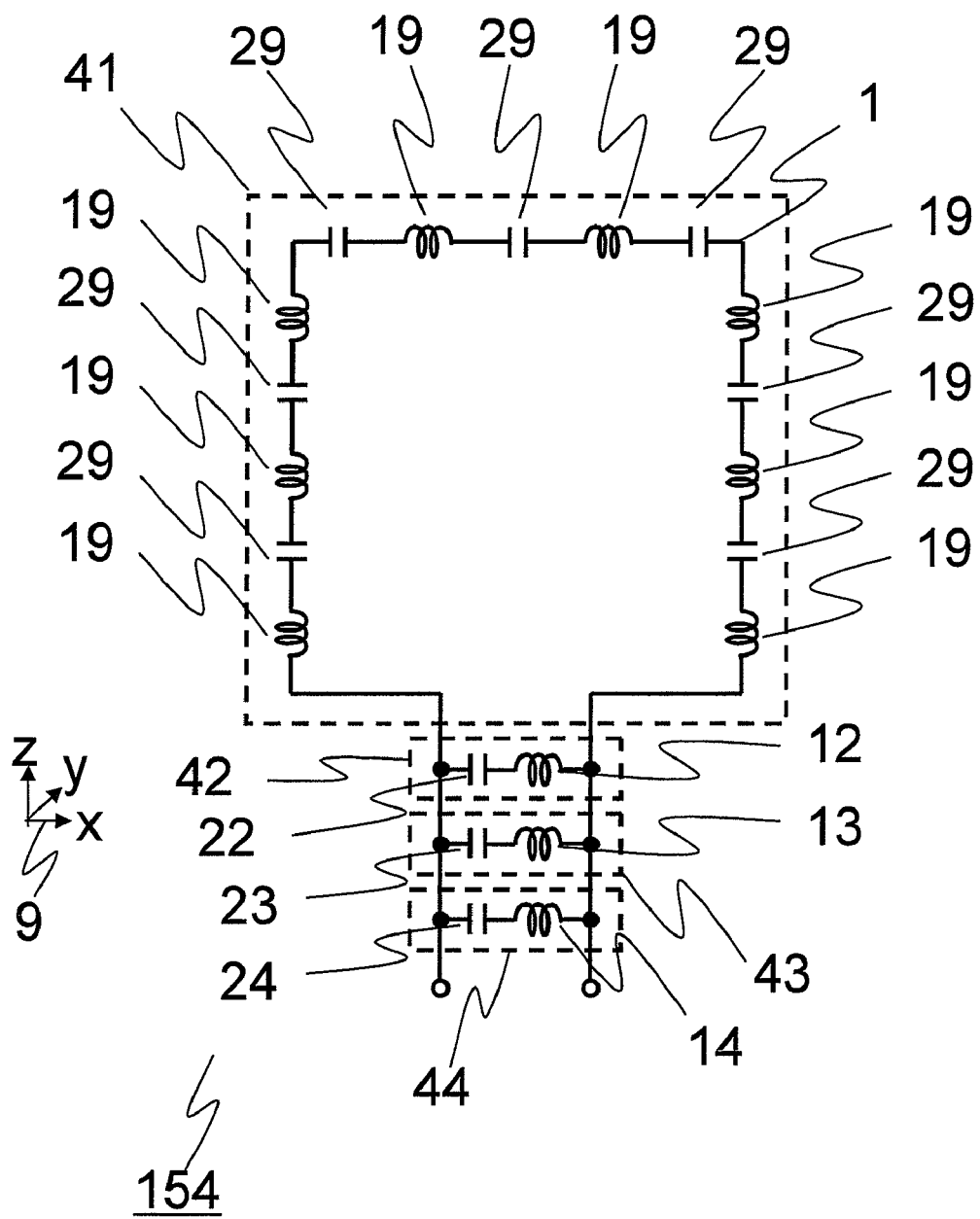

FIG. 10 is a circuit diagram of the triple-tuned loop-type coil of the first embodiment.

FIG. 11A, FIG. 11B, FIG. 11C and FIG. 11D are diagrams for explaining operation of the triple-tuned loop-type coil of the first embodiment.

Figure 12A:
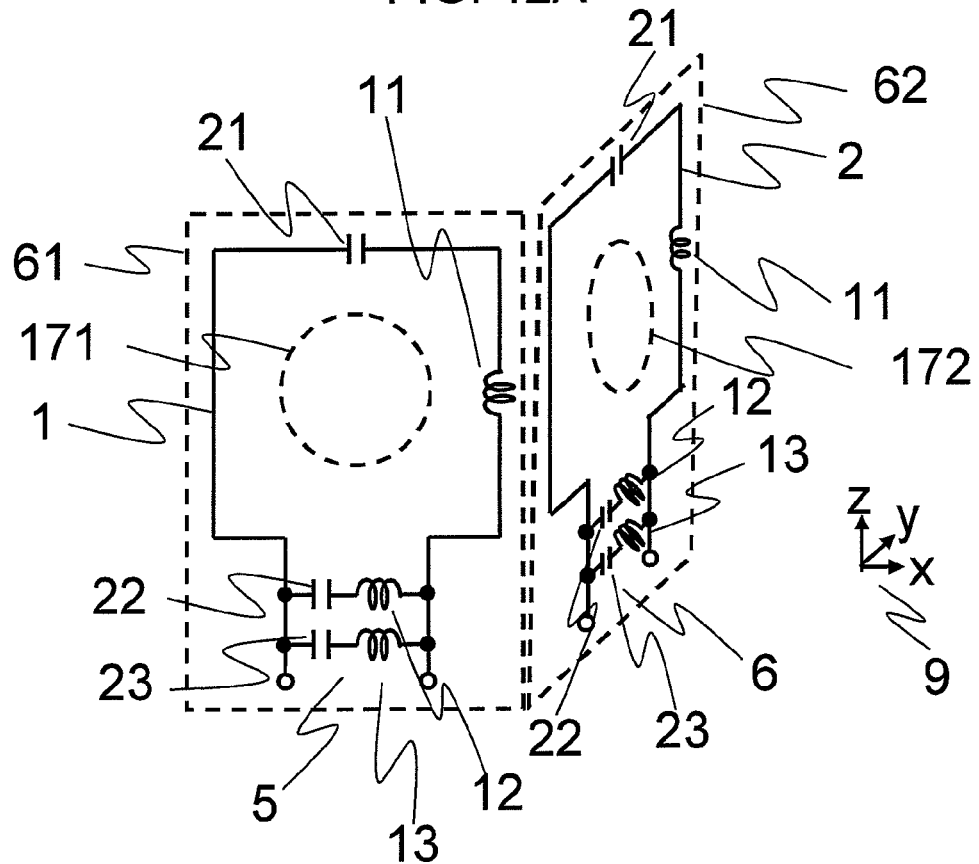
Figure 12B:
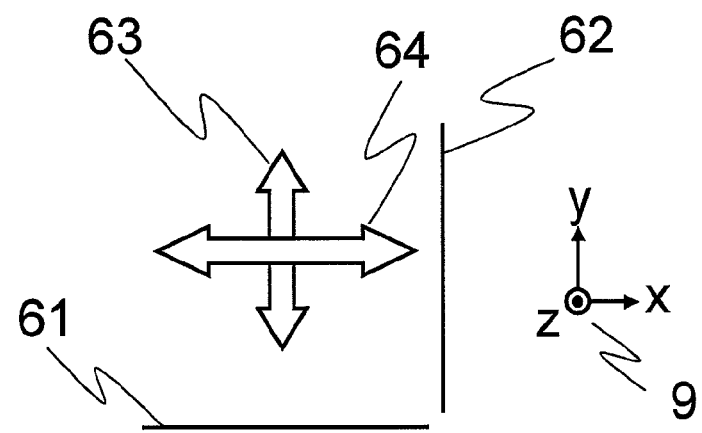

FIG. 12A and FIG. 12B are circuit diagrams of the transmit and receive RF coil of the second embodiment.

Figure 13:
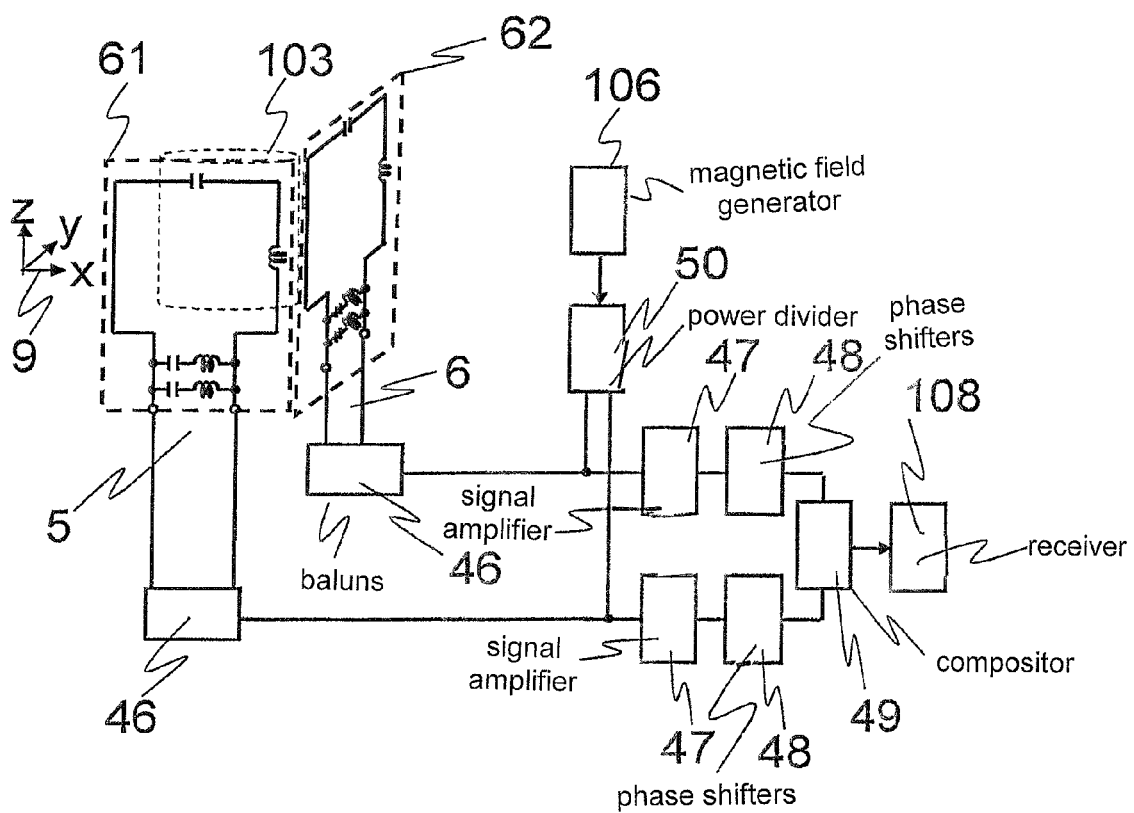

FIG. 13 is a diagram showing an example of connection of the transmit and receive RF coil of the second embodiment.

Figure 14:
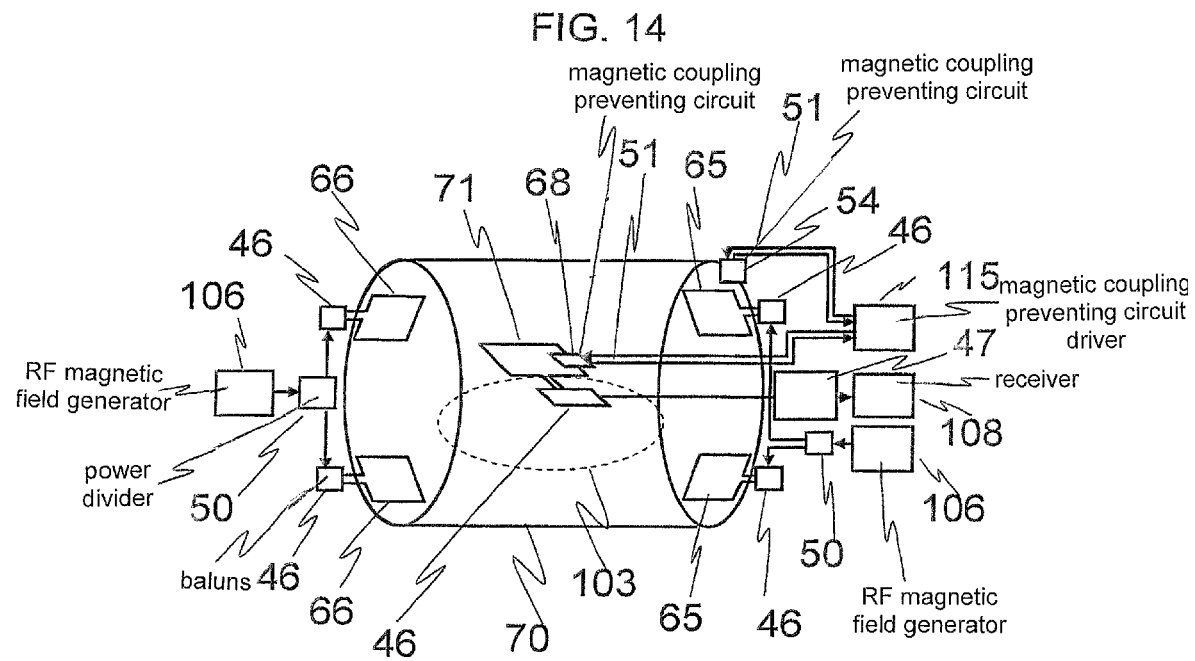

FIG. 14 is a diagram showing connection relation of the RF coil of the third embodiment.

Figure 15A:
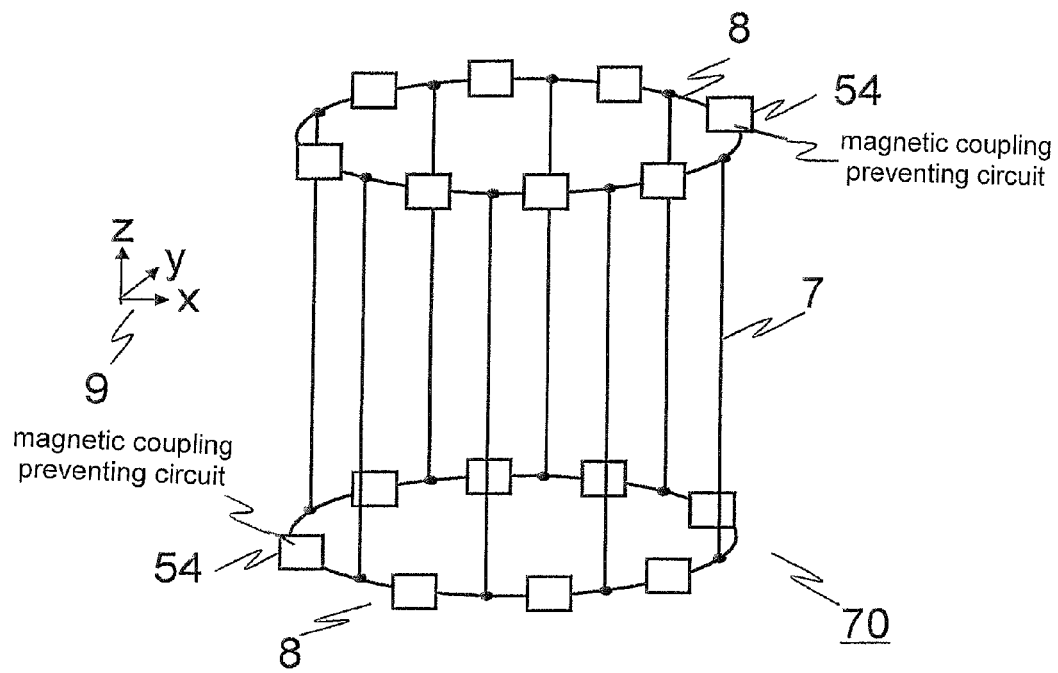
Figure 15B:
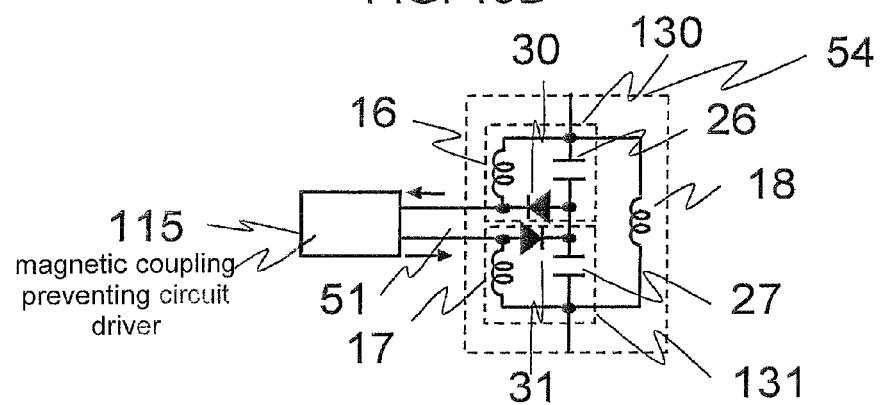

FIG. 15A and FIG. 15B are circuit diagrams of the double-tuned birdcage RF coil of the third embodiment.

Figure 16A:
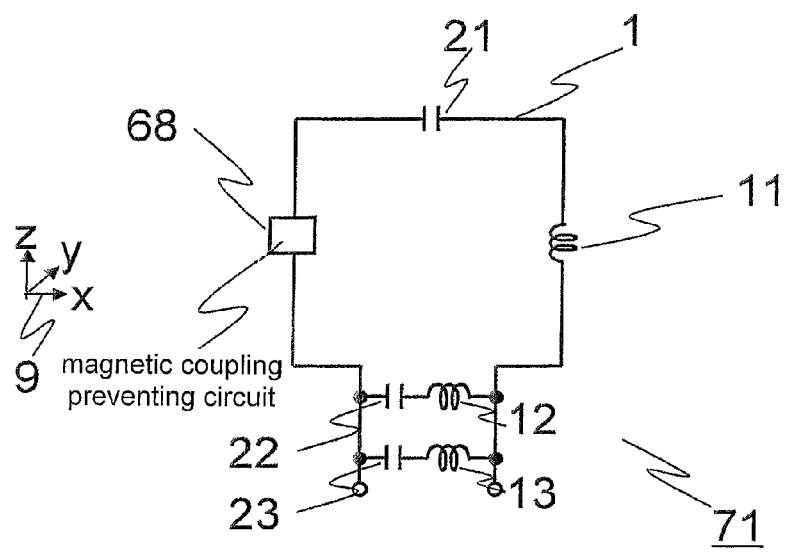
Figure 16B:
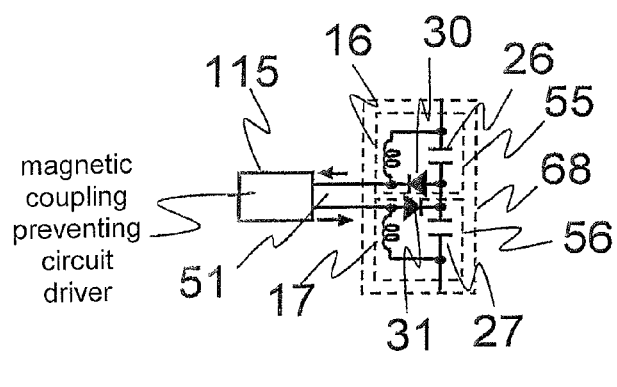
Figure 16C:
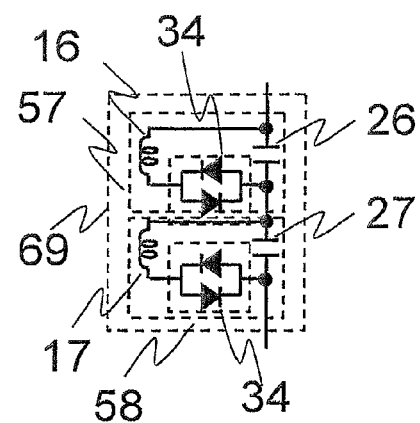

FIG. 16A, FIG. 16B and FIG. 16C are circuit diagrams of the double-tuned loop-type coil of the third embodiment.

Figure 17:
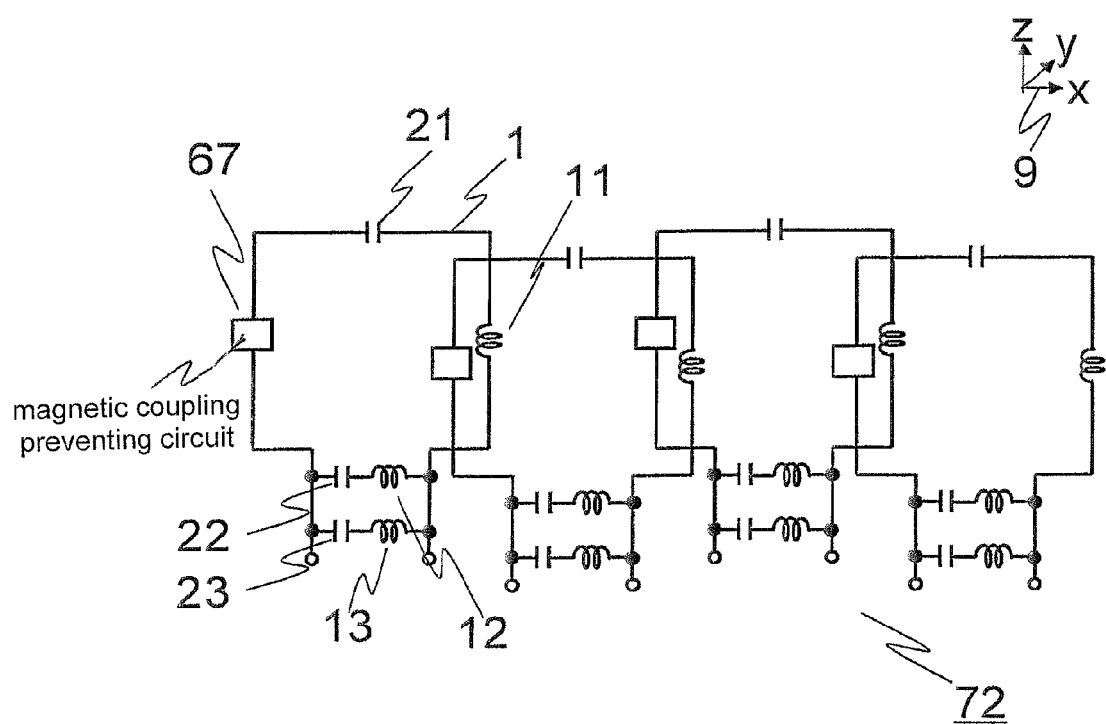

FIG. 17 is a circuit diagram of the double-tuned array coil of the third embodiment.

Figure 18:
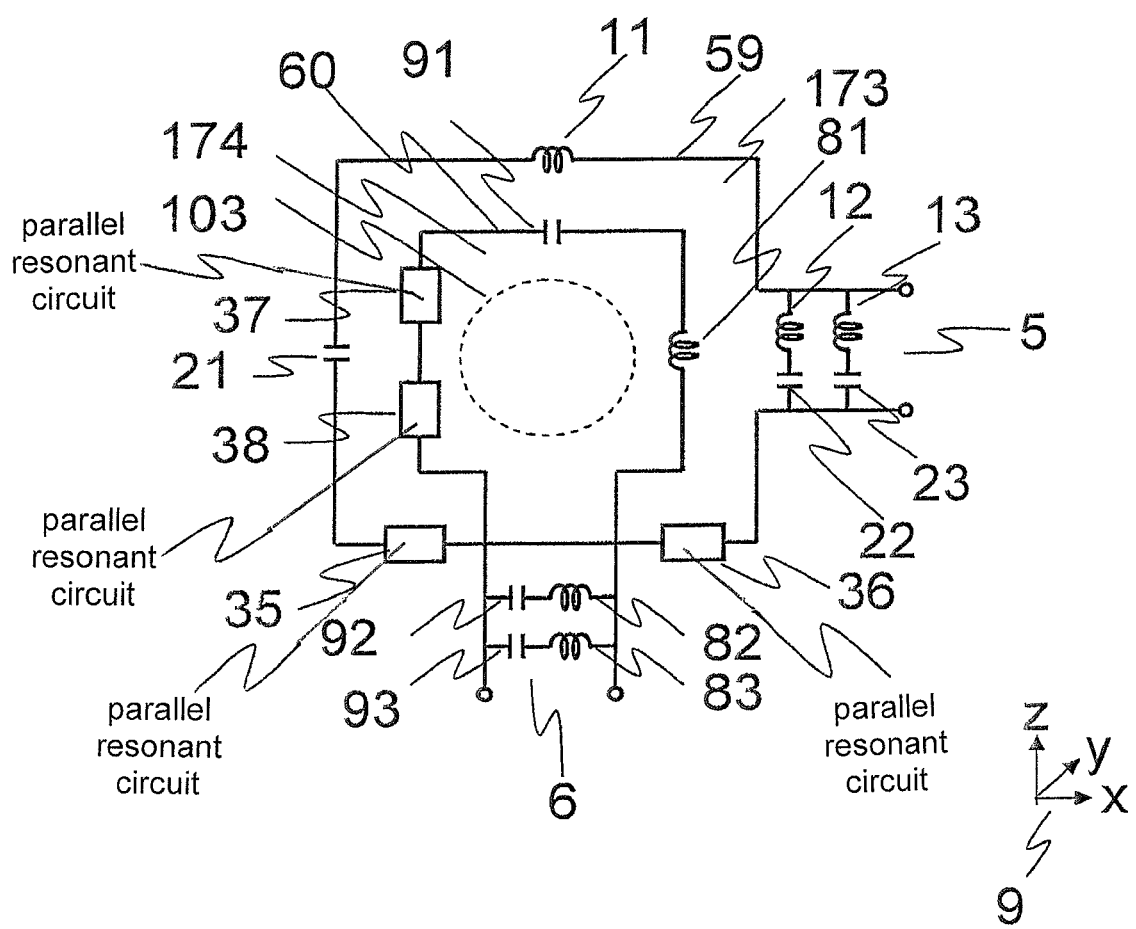

FIG. 18 is a diagram showing an example of connection of the double-tuned loop-type coil of the fourth embodiment.

Figure 19:
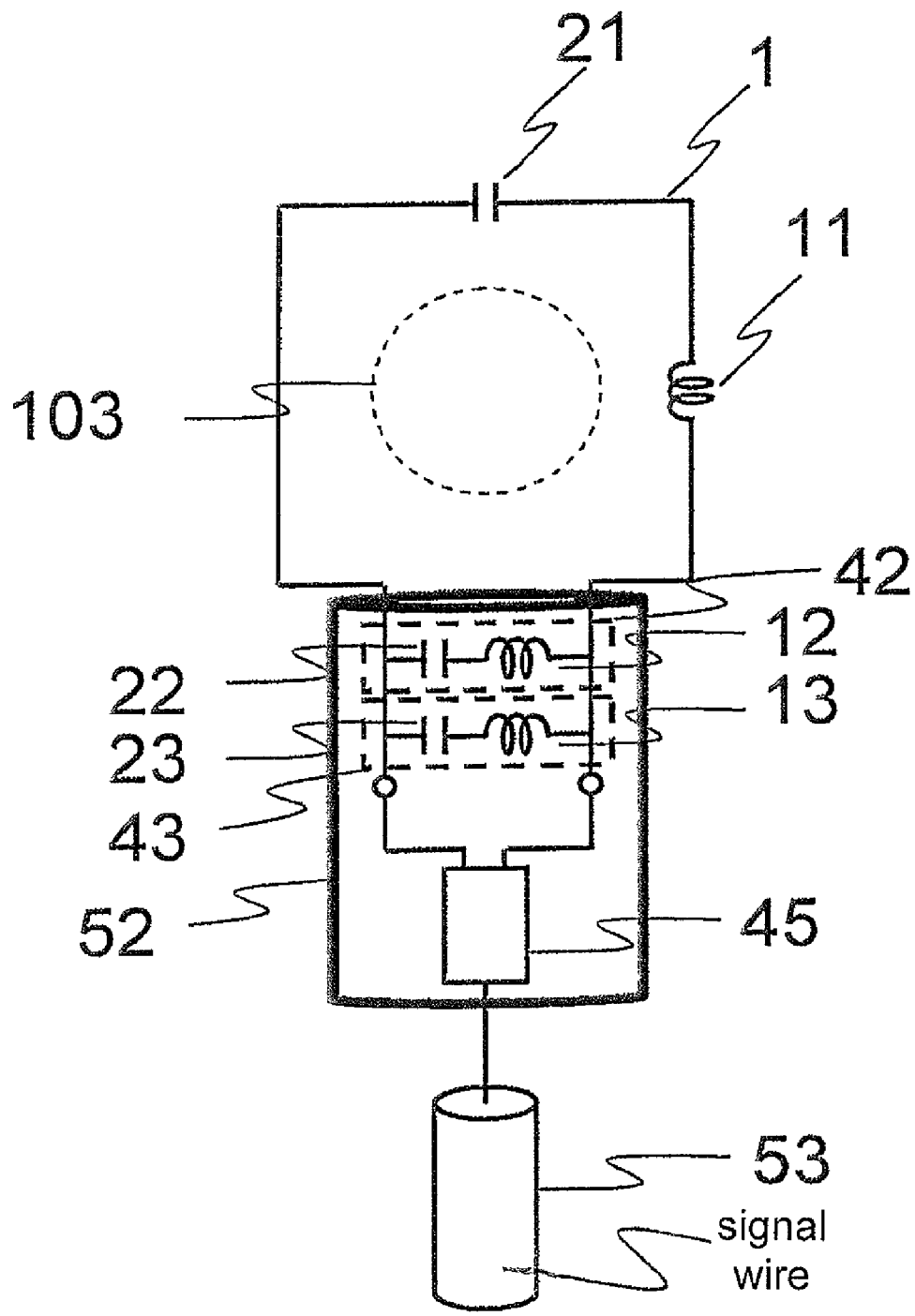

FIG. 19 is a schematic view of the double-tuned loop-type coil of the first embodiment, which is attached with an electric wave shield.

Figure 20:
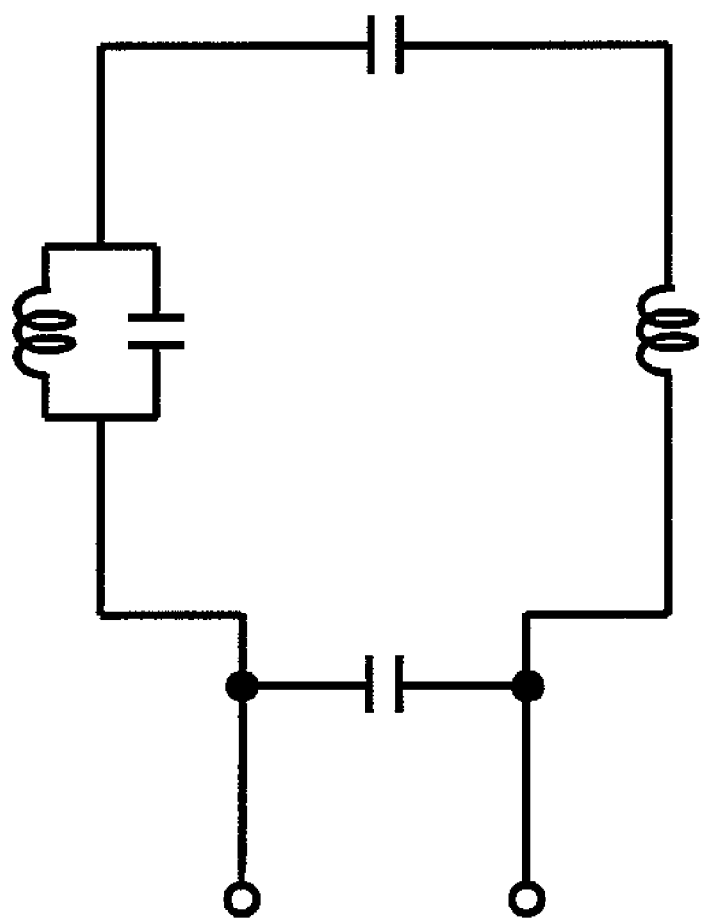

FIG. 20 is a circuit diagram showing configuration of a conventional double-tuned RF coil.

Figure 21:
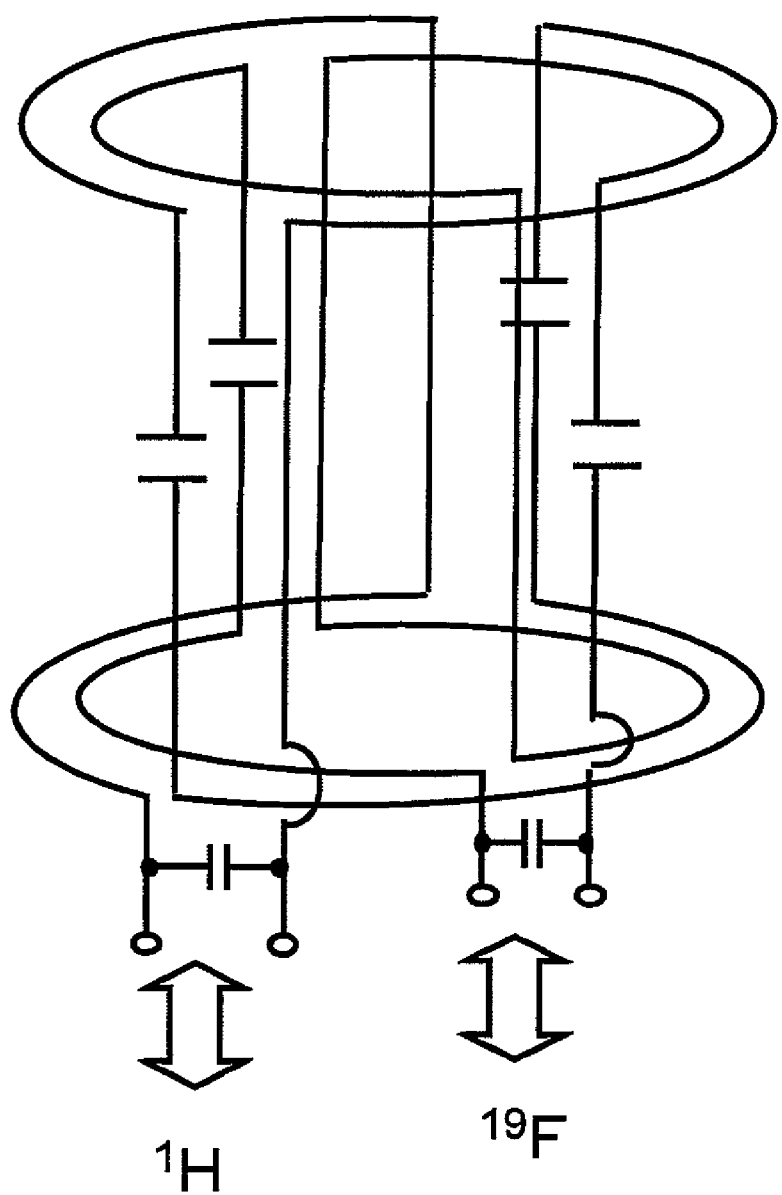

FIG. 21 is a circuit diagram showing configuration of a conventional double-tuned saddle-type RF coil.

DETAILED DESCRIPTION OF THE INVENTION

First Embodiment

Figure 1A:
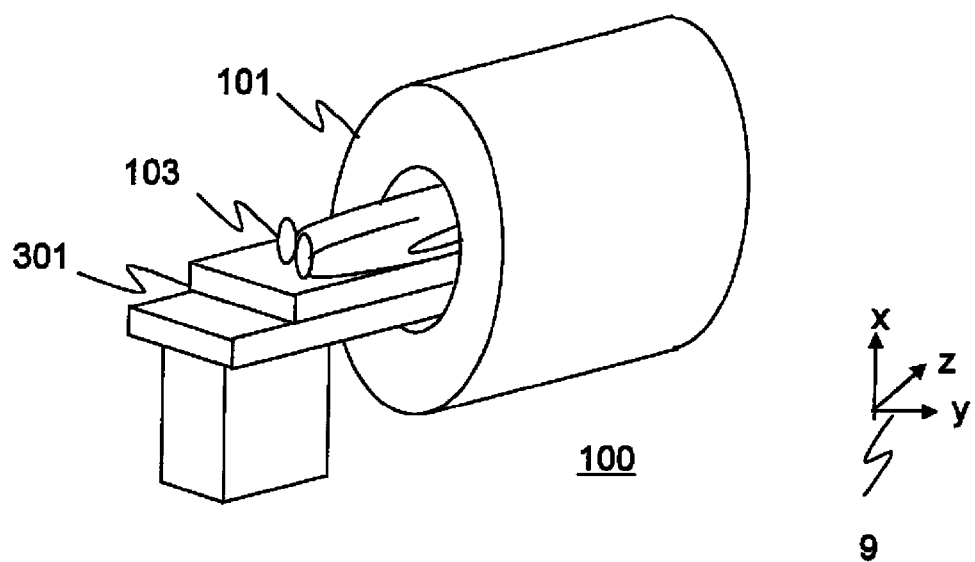
FIG. 1A and FIG. 1B are schematic views of the MRI apparatus based on the first embodiment.
Figure 1B:
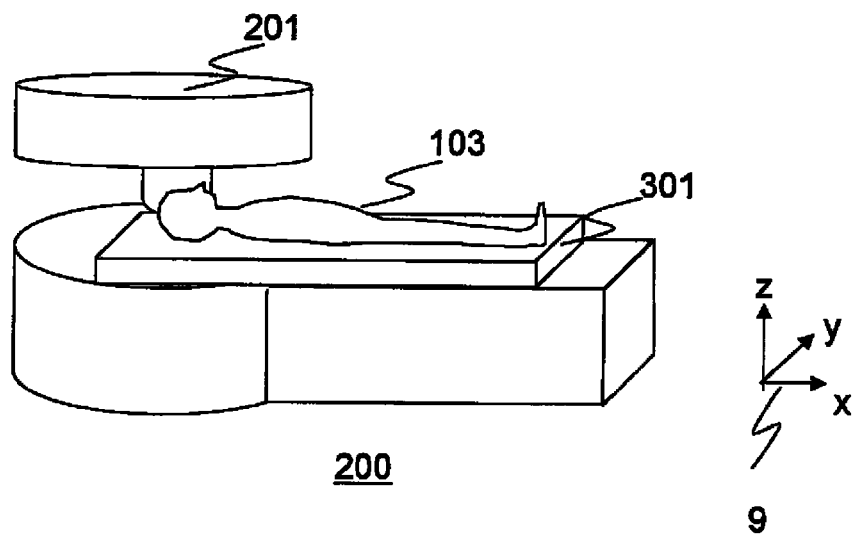

The first embodiment of the RF coil according to the present invention will be explained. The whole configuration of an MRI apparatus having the RF coil of this embodiment will be explained first. FIG. 1A and FIG. 1B are schematic views of the MRI apparatus having the RF coil of this embodiment. In the diagrams, the direction of the z axis in the coordinate 9 is a static magnetic field direction. The MRI apparatus 100 shown in FIG. 1A is provided with a horizontal magnetic field type magnet 101. The MRI apparatus 200 shown in FIG. 1B is provided with a vertical magnetic field type magnet 201. These MRI apparatuses 100 and 200 are provided with a table 301 on which a subject 103 is placed. This embodiment is applicable to both the MRI apparatus 100 provided with the horizontal magnetic field type magnet 101, and the MRI apparatus 200 provided with the vertical magnetic field type magnet 201. Hereafter, the present invention will be explained for the MRI apparatus 100 having the horizontal magnetic field type magnet 101 as an example.

Figure 2:
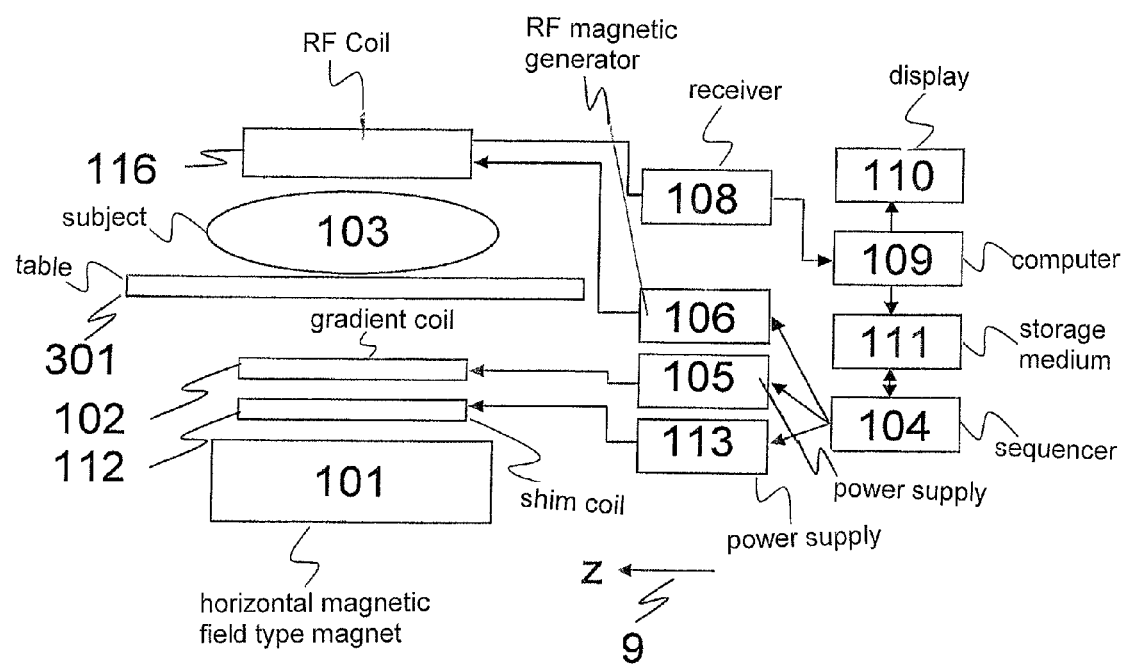
FIG. 2 is a block diagram of the MRI apparatus based on the first embodiment.

FIG. 2 is a block diagram showing the schematic configuration of the MRI apparatus 100. As shown in this diagram, the MRI apparatus 100 is provided with the horizontal magnetic field type magnet 101, a gradient coil 102 which generates a gradient magnetic field, a sequencer 104, and a transmit and receive RF coil 116 which generates a RF magnetic field and receives signals from the subject 103. The gradient coil 102 is connected to a gradient coil power supply 105. The transmit and receive RF coil 116 is connected to the RF magnetic field generator 106 and a receiver 108. The sequencer 104 sends commands to the gradient coil power supply 105 and the RF magnetic field generator 106 to make them generate a gradient magnetic field and a RF magnetic field, respectively. The RF magnetic field is applied on the subject 103 via the transmit and receive RF coil 116. RF signals generated from the subject 103 upon application of the RF magnetic field are detected by the transmit and receive RF coil 116, and detection is performed by the receiver 108. A magnetic resonance frequency as the basis of the detection in the receiver 108 is set by the sequencer 104. The detected signals are sent to a computer 109 via an A/D converter, and signal processing such as image reconstruction is performed in the computer. The results are displayed on a display 110. The detected signals and measurement conditions are stored in a storage medium 111 as required. The sequencer 104 controls the components so that each component operates according to timings and magnitudes programmed beforehand. Furthermore, when adjustment of uniformity of the static magnetic field is required, a shim coil 112 is used. In addition, as the aforementioned transmit and receive RF coil 116, a transmit coil which generates a RF magnetic field and a receive coil which receives signals from the subject 103 may be separately provided, or one coil serving as the both may be used. In the following explanation of this embodiment, a case of using one coil serving as the both will be explained as an example.

Figure 3:
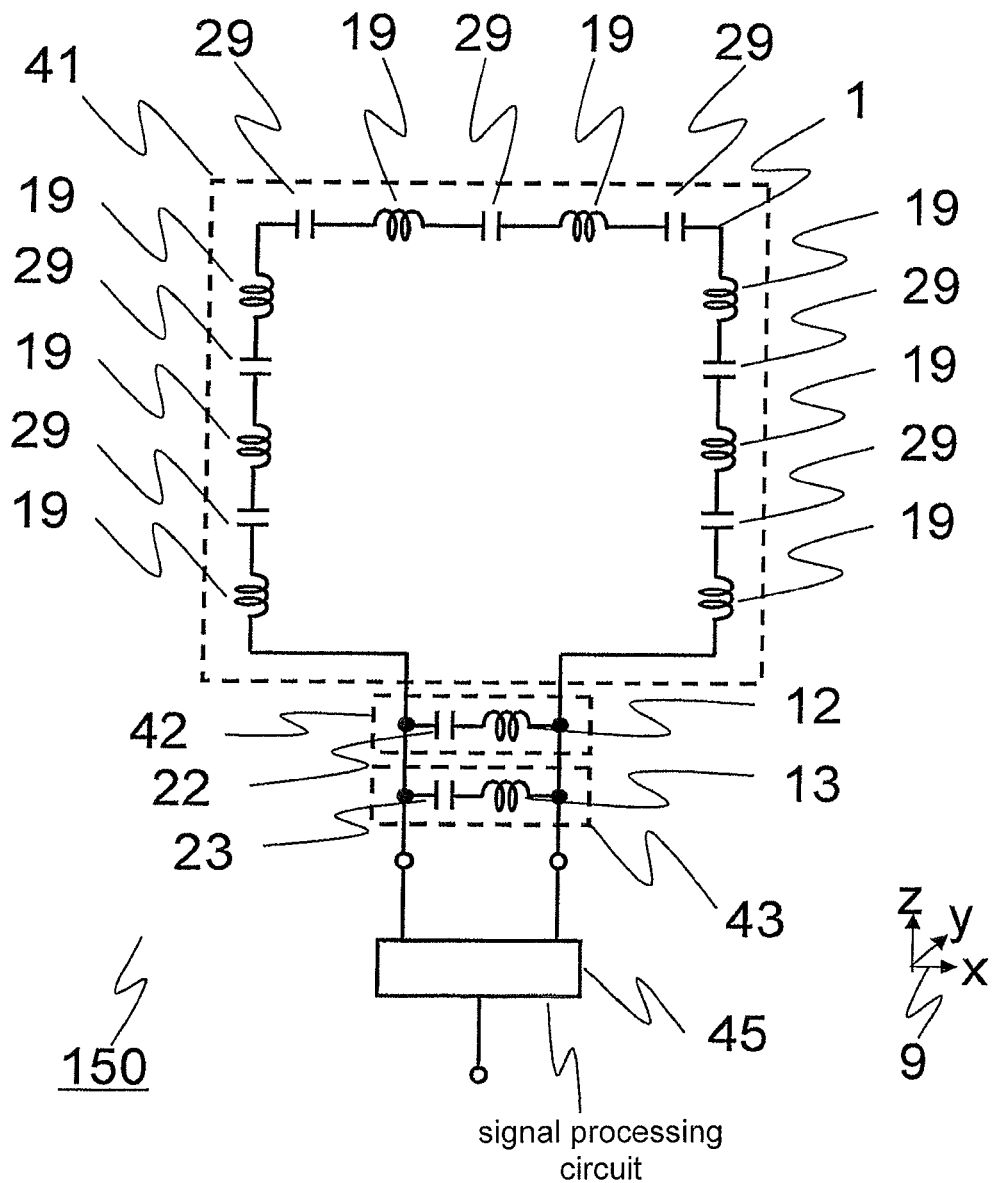
FIG. 3 is a circuit diagram of the double-tuned loop-type coil of the first embodiment.

The transmit and receive RF coil 116 according to this embodiment operates as a double-tuned RF coil. FIG. 3 is a circuit diagram of a double-tuned loop-type coil 150 used as the transmit and receive RF coil 116 of this embodiment. In the diagram, the direction of the z axis in the coordinate 9 is the static magnetic field direction. The double-tuned loop-type coil 150 of this embodiment comprises a first series resonant circuit 41 in which eight inductors 19 and seven capacitors 29 are alternately connected in series, a second series resonant circuit 42 in which a capacitor 22 (capacitance of the capacitor 22 is represented as $C_B$, henceforth the values are represented in the same manner) and an inductor 12 ($L_B$) are connected in series, a third series resonant circuit 43 in which a capacitor 23 ($C_C$) and an inductor 13 ($L_C$) are connected in series, and a signal processing circuit 45. The first series resonant circuit 41, the second series resonant circuit 42, and the third series resonant circuit 43 are connected in parallel in this order, and the signal processing circuit 45 is connected in parallel to the third series resonant circuit 43. The double-tuned loop-type coil 150 of this embodiment is connected to the RF magnetic field generator 106 and the receiver 108 via the signal processing circuit 45. The signal processing circuit 45 includes circuits for processing signals such as balun circuit and impedance matching circuit, and may be further provided with a signal amplifier.

The inductor 19 represents one portion of inductor among portions obtained by dividing the loop coil 1 made of a conductive material into eight. For example, if inductance ($L_A$) of a typical loop coil shall be 1 pH, the inductance of the inductor 19 is 125 nH. The capacitor 29 represents one portion of capacitor among portions obtained by dividing capacitor ($C_A$) inserted into the loop coil 1 in series into seven. The number of the divided portions may be changed depending on the value of capacitance of the capacitor ($C_A$).

The resonance frequencies of the first series resonant circuit 41, the second series resonant circuit 42 and the third series resonant circuit 43 are represented by $f_A$, $f_B$ and $f_C$, respectively. The double-tuned loop-type coil 150 of this embodiment is tuned to the two of different nuclear magnetic resonance frequencies (first resonance frequency $f_1$ and second resonance frequency $f_2$, $f_1 < f_2$) of two kinds of different atomic nuclei by adjusting inductances and capacitances of the inductors and the capacitors. For this purpose, the resonance frequencies $f_A$, $f_B$ and $f_C$ of the series resonant circuits are adjusted so that they satisfy the condition represented by the following Equation (1).

$$f_B < f_1 < f_A < f_2 < f_C \quad (1)$$

Explained hereafter is that if the resonance frequencies of the series resonant circuits are adjusted so that they satisfy the condition of Equation (1) mentioned above, two kinds of magnetic resonance signals of frequencies close to each other can be transmitted and received by the double-tuned loop-type coil 150 using practical inductances and capacitances of the inductors and capacitors, which are constituents of the coil. As an example, one case will be explained here, where, among the magnetic resonance frequencies of two kinds of different atomic nuclei, the first magnetic resonance frequency $f_1$ is 120 MHz, the nuclear magnetic resonance frequency of fluorine in a static magnetic field strength of 3-T (tesla), and the second magnetic resonance frequency $f_2$ is 128 MHz, the nuclear magnetic resonance frequency of hydrogen nuclei in a static magnetic field strength of 3-T.

Figure 4A:
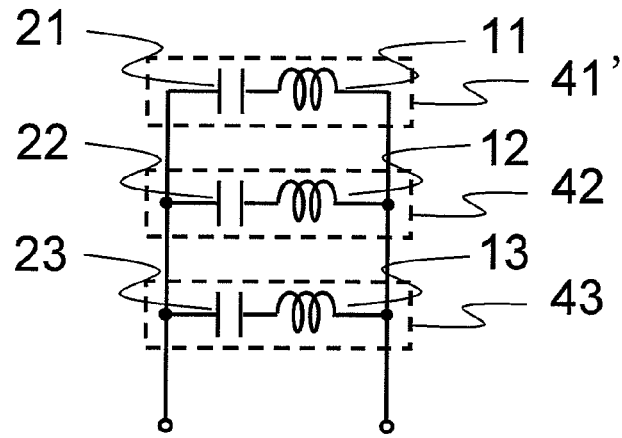
FIG. 4A, FIG. 4B and FIG. 4C are diagrams for explaining operation of the double-tuned loop-type coil of the first embodiment.
Figure 4B:
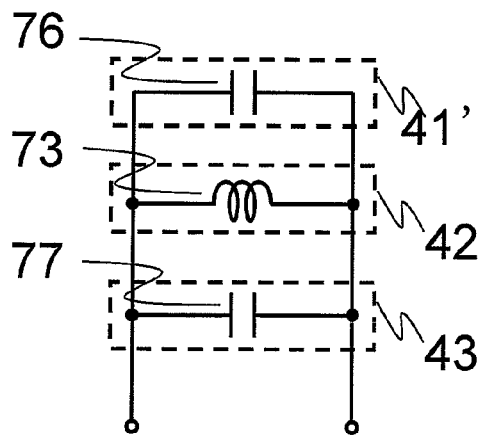
Figure 4C:
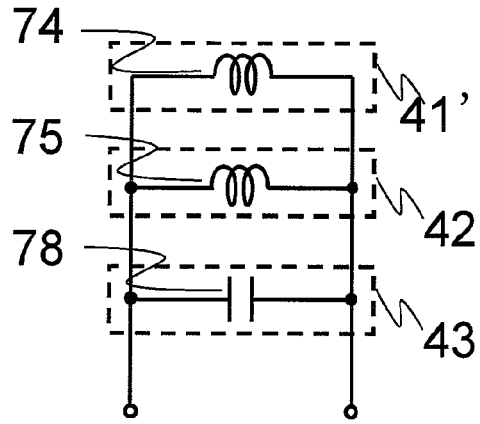

First, operation and characteristics of the double-tuned loop-type coil 150 of this embodiment will be explained by using an equivalent circuit thereof. FIG. 4A, FIG. 4B and FIG. 4C are diagrams for explaining operation of the double-tuned loop-type coil by using an equivalent circuit. FIG. 4A shows an equivalent circuit 500 of the double-tuned loop-type coil 150 of this embodiment. In the circuit of this diagram, the inductance of the inductor 11 ($L_A$) is the combined value of the inductances of the eight inductors 19 connected in series in the double-tuned loop-type coil 150, and the capacitance of the capacitor 21 ($C_A$) is the combined value of the capacitances of seven capacitors 29 connected in series in the double-tuned loop-type coil 150, respectively. As shown in this diagram, the double-tuned loop-type coil 150 of this embodiment can be represented by an equivalent circuit 500 of a circuit, in which three of series resonant circuits (41', 42, 43) each having an inductor and a capacitor, are connected in parallel.

Figure 5A:
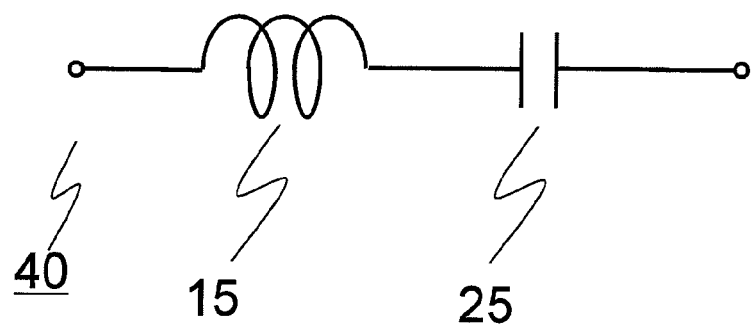
FIG. 5A and FIG. 5B are diagrams for explaining operation of a usual series resonant circuit.
Figure 5B:
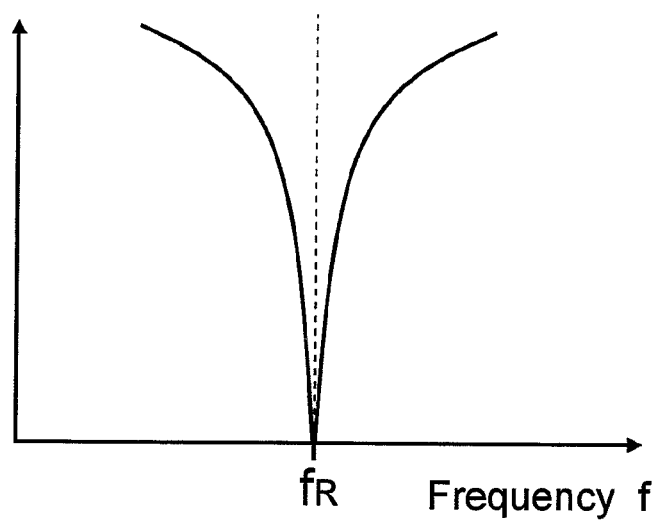

Operation of a usual series resonant circuit 40 will be explained. FIG. 5A and FIG. 5B are diagrams for explaining operation of the series resonant circuit 40. As shown in FIG. 5A, in the series resonant circuit 40, an inductor 15 (L) and a capacitor 25 (C) are connected in series. When frequency of voltage to be applied is represented by f, and angular frequency is represented by $\omega$ ($\omega = 2\pi f$), impedance Z between the both ends of the series resonant circuit 40 is represented by Equation (2).

$$Z = j\omega L + \frac{1}{j\omega C} = j2\pi f L + \frac{1}{j2\pi f C} \quad (2)$$

The impedance Z changes depending on the frequency f as shown in FIG. 5B, and the circuit resonates at a frequency $f = f_R$. In FIG. 5B, in the region of frequency higher than the resonance frequency $f_R$ of the series resonant circuit 40 ($f_R < f$), the impedance Z is represented by Equation (3) and operates as inductive reactance.

$$Z = j2\pi f L \frac{(f/f_R)^2 - 1}{(f/f_R)^2} \quad (3)$$

Here, the value L' of the apparent inductance of the series resonant circuit 40 is represented by Equation (4).

$$L' = \frac{(f/f_R)^2 - 1}{(f/f_R)^2} L \quad (4)$$

On the other hand, in the region of frequency lower than the resonance frequency $f_R$ of the series resonant circuit 40 ($f < f_R$), the impedance Z is represented by Equation (5), and operates as capacitive reactance.

$$Z = \frac{1 - (f/f_R)^2}{j2\pi f C} \quad (5)$$

Here, the value C' of the apparent capacitance of the series resonant circuit 40 is represented by Equation (6).

$$C' = \frac{C}{1 - (f/f_R)^2} \quad (6)$$

As described above, the series resonant circuit 40 differently operates according to the frequency of the applied voltage, i.e., differently operates on the both sides of the resonance frequency as a border. The resonance frequencies $f_A$, $f_B$ and $f_C$ of the series resonant circuits 41', 42 and 43 of the equivalent circuit 500 of the double-tuned loop-type coil 150 of this embodiment are adjusted so as to satisfy the condition of Equation (1). Therefore, when a RF signal of the first resonance frequency $f_1$ is applied, the series resonant circuit 41' and the series resonant circuit 43 of the equivalent circuit 500 operate as capacitive reactance (capacitor), and the series resonant circuit 42 operates as inductive reactance (inductor). The configuration of the equivalent circuit 500 in this case is shown in FIG. 4B. As shown in this diagram, when a RF signal of the first resonance frequency $f_1$ is applied, the equivalent circuit 500 is represented as a parallel resonant circuit 501 in which a capacitor 76 ($C_A'$), an inductor 73 ($L_B'$) and a capacitor 77 ($C_C'$) are connected in parallel.

On the other hand, when a RF signal of the second resonance frequency $f_2$ is applied, the series resonant circuit 41' and the series resonant circuit 42 of the equivalent circuit 500 operate as inductive reactance (inductor), and the series resonant circuit 43 operates as capacitive reactance (capacitor).

The configuration of the equivalent circuit 500 in this case is shown in FIG. 4C. As shown in this diagram, when a RF signal of the second resonance frequency $f_2$ is applied, the equivalent circuit 500 is represented as a parallel resonant circuit 502 in which an inductor 74 ($L_A''$), an inductor 75 ($L_B''$) and a capacitor 78 ($C_C''$) are connected in parallel.

Therefore, if the capacitances and inductances of the capacitors and inductors are adjusted, respectively, so that the resonance frequency of the parallel resonant circuit 501 should be the first resonance frequency $f_1$, and the resonance frequency of the parallel resonant circuit 502 should be the second resonance frequency $f_2$, the double-tuned loop-type coil 150 of this embodiment represented by this equivalent circuit 500 resonates at the first resonance frequency $f_1$ and second resonance frequency $f_2$. That is, it comes to be able to transmit and receive two kinds of magnetic resonance signals. Hereafter, adjustment of the capacitances and inductances of the capacitors and inductors will be explained.

The capacitances $C_A'$ and $C_C'$ of the capacitors 76 and 77 of the parallel resonant circuit 501 are represented by Equations (7) and (8) mentioned below in accordance with Equation (6). Moreover, the inductance $L_B'$ of the inductor 73 is represented by Equation (9) mentioned below in accordance with Equation (4).

$$C_A' = \frac{C_A}{1 - (f/f_A)^2} \quad (7)$$

$$C_C' = \frac{C_C}{1 - (f/f_C)^2} \quad (8)$$

$$L_B' = \frac{(f/f_B)^2 - 1}{(f/f_B)^2} L_B \quad (9)$$

Here, resonance frequency $f_{op}$ of a parallel resonant circuit constituted by an inductor and a capacitor, inductance L of the inductor and capacitance C of the capacitor generally satisfy the following condition.

$$f_{op} = \frac{1}{2\pi\sqrt{LC}} \quad (10)$$

When the parallel resonant circuit 501 is adjusted so as to be tuned to the first resonance frequency $f_1$, the resonance frequency of the parallel resonant circuit 501 shall be the first resonance frequency $f_1$. Therefore, $f_1$, capacitances $C_A'$ and $C_C'$ of the capacitors 76 and 77, and inductance $L_B'$ of the inductor 73 satisfy Equation (10). Accordingly, the relation of $f_1$, $C_A'$, $C_C'$ and $L_B'$ is represented by Equation (11).

$$f_1 = \frac{1}{2\pi\sqrt{L_B'(C_A' + C_C')}} \quad (11)$$

When Equations (7), (8), (9) and (11) are solved for $L_A$, $L_B$ and $L_C$, inductances of the inductors 11, 12 and 13 ($L_A$, $L_B$, $L_C$) have the following relation.

$$\frac{f_1^2}{f_1^2 - f_B^2} \frac{1}{L_B} = \frac{f_1^2}{f_A^2 - f_1^2} \frac{1}{L_A} + \frac{f_1^2}{f_C^2 - f_1^2} \frac{1}{L_C} \quad (12)$$

When Equations (9), (7), (8) and (11) are similarly solved for $C_A$, $C_B$ and $C_C$, capacitances of the capacitors 21, 22 and 23 ($C_A$, $C_B$, $C_C$) have the following relation.

$$\frac{C_B}{(f_1/f_B)^2 - 1} = \frac{C_A}{1 - (f_1/f_A)^2} + \frac{C_C}{1 - (f_1/f_C)^2} \quad (13)$$

On the other hand, inductances $L_A''$ and $L_B''$ of the inductors 74 and 75 of the parallel resonant circuits 502 are represented by Equations (14) and (15) mentioned below, respectively, in accordance with Equation (4). Moreover, capacitance $C_C''$ of the capacitor 78 is represented by Equation (16) mentioned below in accordance with Equation (6).

$$L_A'' = \frac{(f/f_A)^2 - 1}{(f/f_A)^2} L_A \quad (14)$$

$$L_B'' = \frac{(f/f_B)^2 - 1}{(f/f_B)^2} L_B \quad (15)$$

$$C_C'' = \frac{C_C}{1 - (f/f_C)^2} \quad (16)$$

When the parallel resonant circuit 502 is adjusted so as to be tuned to the second resonance frequency $f_2$, the resonance frequency of the parallel resonant circuit 502 shall be the second resonance frequency $f_2$. Therefore, $f_2$, inductances $L_A''$ and $L_B''$ of the inductors 74 and 75, and capacitance $C_C''$ of the capacitor 78 satisfy the condition of Equation (10). That is, the relation of $f_2$, $L_A''$, $L_B''$ and $C_C''$ is represented by Equation (17).

$$f_2 = \frac{1}{2\pi}\sqrt{\frac{L_A''^{-1} + L_B''^{-1}}{C_C''}} \quad (17)$$

When Equations (14), (15), (16) and (17) are solved for $L_A$, $L_B$ and $L_C$, the inductances of the inductors 11, 12 and 13 ($L_A$, $L_B$, $L_C$) satisfy the following relation.

$$\frac{f_2^2}{f_C^2 - f_2^2} \frac{1}{L_C} = \frac{f_2^2}{f_2^2 - f_A^2} \frac{1}{L_A} + \frac{f_2^2}{f_2^2 - f_B^2} \frac{1}{L_B} \quad (18)$$

When Equations (14), (15), (16) and (17) are similarly solved for $C_A$, $C_B$ and $C_C$, capacitances of the capacitors 21, 22 and 23 ($C_A$, $C_B$, $C_C$) satisfy the following relation.

$$\frac{C_C}{1 - (f_2/f_C)^2} = \frac{C_A}{(f_2/f_A)^2 - 1} + \frac{C_B}{(f_2/f_B)^2 - 1} \quad (19)$$

Therefore, since the inductances $L_A$, $L_B$ and $L_C$ of the inductors need to simultaneously satisfy the relations of Equations (12) and (18), the inductance of the inductor 12 ($L_B$) and the inductance of the inductor 13 ($L_C$) are represented by Equations (21) and (20), respectively, by using the resonance frequencies $f_1$, $f_2$, $f_A$, $f_B$, $f_C$ and $L_A$.

$$L_B = \left( \frac{f_C^2 - f_1^2}{f_1^2 - f_B^2} - \frac{f_C^2 - f_2^2}{f_2^2 - f_B^2} \right) \left( \frac{f_C^2 - f_2^2}{f_2^2 - f_A^2} + \frac{f_C^2 - f_1^2}{f_A^2 - f_1^2} \right)^{-1} L_A \quad (20)$$

$$L_C = \left( \frac{f_2^2 - f_B^2}{f_C^2 - f_2^2} - \frac{f_1^2 - f_B^2}{f_C^2 - f_1^2} \right) \left( \frac{f_1^2 - f_B^2}{f_A^2 - f_1^2} + \frac{f_2^2 - f_B^2}{f_2^2 - f_A^2} \right)^{-1} L_A \quad (21)$$

On the other hand, since the capacitances $C_A$, $C_B$ and $C_C$ of the capacitors need to simultaneously satisfy the relations of Equations (13) and (19), the capacitances of the capacitor 22 ($C_B$) and the capacitor 23 ($C_C$) are represented by Equations (22) and (23), respectively, by using the resonance frequencies $f_1$, $f_2$, $f_A$, $f_B$, $f_C$ and $C_A$.

$$C_B = \quad (22)$$
$$\left( \frac{1 - (f_1/f_C)^2}{1 - (f_1/f_A)^2} + \frac{1 - (f_2/f_C)^2}{(f_2/f_A)^2 - 1} \right) \left( \frac{1 - (f_1/f_C)^2}{(f_1/f_B)^2 - 1} - \frac{1 - (f_2/f_C)^2}{(f_2/f_B)^2 - 1} \right)^{-1} C_A$$

$$C_C = \quad (23)$$
$$\left( \frac{(f_1/f_B)^2 - 1}{1 - (f_1/f_A)^2} + \frac{(f_2/f_B)^2 - 1}{(f_2/f_A)^2 - 1} \right) \left( \frac{(f_2/f_B)^2 - 1}{1 - (f_2/f_C)^2} - \frac{(f_1/f_B)^2 - 1}{1 - (f_1/f_C)^2} \right)^{-1} C_A$$

By using the aforementioned relations obtained for the equivalent circuit 500, capacitances and inductances of the capacitors and inductors of the double-tuned loop-type coil 150 of this embodiment are calculated.

First, the resonance frequency $f_A$ of the series resonant circuit 41 is determined. As mentioned above, the first resonance frequency $f_1$ is 120 MHz, and the second resonance frequency $f_2$ is 128 MHz in this case. Therefore, the resonance frequency $f_A$ of the series resonant circuit 41 is defined to be between 120 MHz and 128 MHz in accordance with Equation (1). Here, for example, it is determined to be 124 MHz.

Then, the combined value of the inductances of the series resonant circuit 41, $L_A$, is determined. In this case, it is determined to be, for example, 1 μH, which is an inductance of a typical loop coil. Therefore, the inductance of each of the eight inductors 19 constituting the series resonant circuit 41 should be 125 nH, respectively.

Further, the combined value of the capacitances of the series resonant circuit 41, $C_A$, is determined. In a series resonant circuit, the resonance frequency $f_{os}$, inductance L and capacitance C thereof are generally in the relation represented by Equation (24) mentioned below.

$$f_{os} = \frac{1}{2\pi\sqrt{LC}} \quad (24)$$

If this relation is applied to the series resonant circuit 41, the combined value of capacitances, $C_A$, is calculated to be 1.65 pF. Therefore, the capacitance of each of the seven capacitors 29 constituting the series resonant circuit 41 should be 11.6 pF.

Then, the resonance frequency $f_B$ of the series resonant circuit 42 and the resonance frequency $f_C$ of the series resonant circuit 43 are determined so as to satisfy Equation (1). In this determination, the values calculated in accordance with Equations (20), (21), (22) and (23) are determined so that the inductance should be between 10 and 200 nH, and the capacitance should be 10 to 200 pF, in order that the RF loss of the inductors and capacitors constituting the respective circuits should become low, and adjustment thereof should become easy. A frequency region of $f_B$ and $f_C$ satisfying Equation (1) is shown in FIG. 6A. Further, frequency regions of such $f_B$ and $f_C$ that $L_B$ and $L_C$ calculated in accordance with Equations (20) and (21) should be between 10 and 200 nH, which enable actual production and adjustment thereof, are shown in FIG. 6B and FIG. 6C. Similarly, frequency regions of such $f_B$ and $f_C$ that $C_B$ and $C_C$ calculated in accordance with Equations (22) and (23) should be between 10 and 200 pF, which provide relatively low RF loss, are shown in FIG. 6D and FIG. 6E. Moreover, frequency regions of $f_B$ and $f_C$ that satisfy all the conditions of the regions of FIG. 6A to FIG. 6E are shown in FIG. 6F. Any combination of $f_B$ and $f_C$ in this region is sufficient. In this case, for example $f_B$ and $f_C$ are determined to be 93.6 MHz and 156 MHz, respectively.

Finally, by using the resonance frequencies $f_1$, $f_2$, $f_B$ and $f_C$, and $L_A$ and $C_A$ determined as described above, $L_B$, $L_C$, $C_B$ and $C_C$ are calculated in accordance with Equations (20), (21), (22) and (23). As a result, $L_B$, $L_C$, $C_B$ and $C_C$ are determined to be 24.5 nH, 30.7 nH, 42.6 pF and 94.3 pF, respectively. These are within the aforementioned ranges of inductance and capacitance.

By adjusting the inductances and capacitances as follows: $L_A=1$ μH, $L_B=24.5$ nH, $L_C=30.7$ nH, $C_A=1.65$ pF, $C_B=42.6$ pF and $C_C=94.3$ pF as described above, the double-tuned loop-type coil 150 of this embodiment resonates at both the frequencies of 120 MHz, the nuclear magnetic resonance frequency of fluorine at 3-T, and 128 MHz, the nuclear magnetic resonance frequency of hydrogen nuclei at 3-T, and it transmits and receives magnetic resonance signals of fluorine and hydrogen nuclei.

As described above, the double-tuned loop-type coil 150 of this embodiment is tuned to two kinds of magnetic resonance frequencies close to each other so as to irradiate RF magnetic fields of two kinds of magnetic resonance frequencies highly efficiently and uniformly and receive two kinds of magnetic resonance signals with high sensitivity and uniform sensitivity profile. Further, it realizes transmission and reception of magnetic resonance signals of two kinds of frequencies close to each other by using capacitors and inductors having practical capacitance or inductance without using a capacitor having a large capacitance inviting RF loss or an inductor having a small inductance inviting difficulty in adjustment. Therefore, RF loss caused by the inductor or capacitor can be reduced, and reception sensitivity and transmission efficiency of RF coils for magnetic resonance signals of two kinds of frequencies close to each other can be improved.

Further, as seen from the aforementioned configuration, the double-tuned loop-type coil 150 of this embodiment does not have any trap circuit, which is not involved in signal detection of the RF coil, in the signal detection coil. Therefore, uniformity of the sensitivity profile of the RF coil can be improved without disturbance of sensitivity profile of the RF coil by trap circuit.

Furthermore, by disposing the loop coil 1 of the double-tuned loop-type coil 150 of this embodiment in contact with the subject 103, magnetic resonance signals emitted from portions around the portion in contact with the loop coil can be detected with high sensitivity.

Explained for this embodiment as an example is a case where the combination of the first resonance frequency and the second resonance frequency are that of the nuclear magnetic resonance frequencies of fluorine and hydrogen nuclei. However, the combination is not limited to this combination, provided that a combination in which one resonance frequency is not more than 70% of the other resonance frequency is preferred. For example, combinations of fluorine and helium ($^3$He), phosphorus ($^{31}$P) and lithium ($^7$Li), xenon ($^{129}$Xe) and sodium ($^{23}$Na), xenon ($^{129}$Xe) and carbon ($^{13}$C), sodium ($^{23}$Na) and carbon ($^{13}$C), oxygen ($^{19}$O) and heavy water ($^1$H), and so forth can be contemplated. However, the combinations of atomic nuclei are of course not limited to these.

In addition, the shape of the double-tuned loop-type coil 150 of this embodiment is not limited to the aforementioned shape. It is sufficient that equivalent circuit thereof is equivalent to the equivalent circuit 500.

For example, the portion of the loop coil 1 may have a shape of saddle-type coil. A double-tuned saddle-type coil 151 is shown in FIG. 7, which is a modified version of the double-tuned loop-type coil of this embodiment. In the diagram, the direction of the z axis in the coordinate 9 is the static magnetic field direction. As shown in the diagram, the double-tuned saddle-type coil 151 comprises two facing loops of the saddle-type loop coil 1 connected so that they should generate magnetic fields in the same direction, and it has a shape in which the planes of the loops are curved so that planes should be along a cylindrical side.

Further, for example, the portion of the loop coil 1 may have a shape of butterfly-type coil. A double-tuned butterfly-type coil 152 is shown in FIG. 8, which is a modified version of the double-tuned loop-type coil of this embodiment. In the diagram, the direction of the z axis in the coordinate 9 is the static magnetic field direction. As shown in the diagram, the double-tuned saddle-type coil 152 has a shape in which two adjacent loops in the same plane of the butterfly-shaped loop coil 1 are connected so that they should generate magnetic fields in reverse directions.

Further, for example, the portion of the loop coil 1 may have a shape of solenoid-type coil. A double-tuned solenoid-type coil 153 is shown in FIG. 9, which is a modified version of the double-tuned loop-type coil of this embodiment. In the diagram, the direction of the z axis in the coordinate 9 is the static magnetic field direction.

Since the double-tuned saddle-type coil 151, the double-tuned butterfly-type coil 152, and the double-tuned solenoid-type coil 153 are represented by the equivalent circuit 500, the circuit configuration and operation principle thereof are the same as those of the double-tuned loop-type coil 150. Therefore, the double-tuned saddle-type coil 151, the double-tuned butterfly-type coil 152, and the double-tuned solenoid-type coil 153 operate as RF coils for magnetic resonance signals having frequencies close to each other, of which typical examples are signals of a combination of hydrogen nuclei and fluorine nuclei. However, since the coil shapes of them are different from that of the aforementioned double-tuned loop-type coil 150, and inductance of the inductor 11 ($L_A$) and capacitance of the capacitor 21 ($C_A$) of the loop coil vary, $L_B$, $L_C$, $C_B$ and $C_C$ should be correspondingly determined.

As described above, the double-tuned saddle-type coil 151, the double-tuned butterfly-type coil 152, and the double-tuned solenoid-type coil 153 enable to realize an RF coil which can transmit and receive magnetic resonance signals of two kinds of frequencies close to each other without using a capacitor having such a large capacitance that RF loss should be accompanied and an inductor having a small inductance which causes difficulty in adjustment of inductance. Therefore, the RF loss caused by an inductor or a capacitor can be markedly decreased, and reception sensitivity and transmission efficiency of an RF coil for magnetic resonance signals of two kinds of frequencies close to each other are improved. Further, since any trap circuit which does not participate in signal detection of the RF coil is not disposed in the signal detection coil, sensitivity profile of the RF coil is not disturbed by trap circuit, and thus uniformity of the sensitivity profile of the RF coil can be improved.

Furthermore, since the double-tuned saddle-type coil 151 has a saddle shape, by placing the subject 103 such as arm, leg or body thereof in the saddle-type coil as shown in FIG. 7, two kinds of magnetic resonance signals from regions locating in deep parts can be detected with high sensitivity and uniform distribution, in addition to signals from the surface of the subject 103.

Further, since the coil of double-tuned butterfly-type coil 152 has a butterfly shape, the subject 103 such as arm, leg or body thereof does not enter into a closed space. By disposing the subject 103 under or over the butterfly-type coil as shown in FIG. 8, two kinds of magnetic resonance signals from regions locating in deep parts can be detected with high sensitivity and uniform distribution.

Further, since the double-tuned solenoid-type coil 153 has a solenoid shape, by placing the subject 103 such as arm, leg or body thereof in the solenoid-type coil as shown in FIG. 9, two kinds of magnetic resonance signals from regions locating in deep parts can be detected with high sensitivity and uniform distribution, in addition to signals from the surface of the subject 103. Moreover, the solenoid-type coil shows a uniform sensitivity profile in a larger region compared with the saddle-type coil.

In these modified versions of this embodiment, one capacitor 21 is disposed in the loop coil 1. However, two or more capacitors may also be disposed in the loop coil.

Further, in the aforementioned embodiment and the modified versions thereof, the double-tuned RF coil which can transmit and receive two kinds of different magnetic resonance signals is explained as an example. However, magnetic resonance signals which can be transmitted and received by the RF coil to which the present invention is applicable are not limited to two kinds of magnetic resonance signals. For example, the coil may be a triple-tuned loop-type coil which can transmit and receive three kinds of different magnetic resonance signals.

A triple-tuned loop-type coil 154 as a modified version of the double-tuned loop-type coil of this embodiment is shown in FIG. 10. As shown in this diagram, the triple-tuned loop-type coil 154 comprises a fourth series resonant circuit 44 including a capacitor 24 ($C_D$) and an inductor 14 ($L_D$) connected in series, which is connected in parallel with the third series resonant circuit 43, in addition to the components of the double-tuned loop-type coil 150.

The resonance frequencies ($f_A$, $f_B$, $f_C$, $f_D$) of the first, second, third and fourth series resonant circuits 41, 42, 43 and 44 are adjusted so as to satisfy the relation (Equations 25) mentioned below so that the triple-tuned loop-type coil 154 should resonate at the first, second and third resonance frequencies ($f_1$, $f_2$, $f_3$) corresponding to the magnetic resonance frequencies of the first, second and third elements.

$$f_B < f_1 < f_A < f_2 < f_C < f_3 < f_D \qquad (25)$$

Also in this modification, the inductances $L_B$, $L_C$ and $L_D$ of the inductors 12, 13 and 14 and the capacitances $C_B$, $C_C$ and $C_D$ of the capacitors 22, 23 and 24 are determined according to the first, second and third resonance frequencies $f_1$, $f_2$ and $f_3$, the combined value of inductance $L_A$ of the inductors and the combined value of capacitance $C_A$ of the capacitors in the loop coil 1 portion as in the case of the double-tuned loop-type coil 150.

Figure 11A:
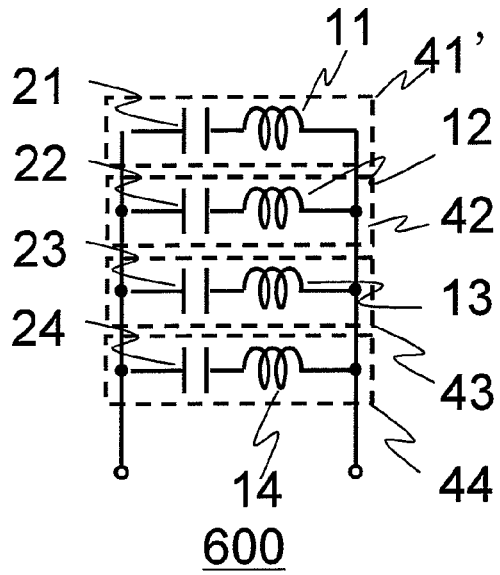

Operation and characteristics of the triple-tuned loop-type coil 154 of this modification will be explained by using an equivalent circuit 600 shown in FIG. 11A. As shown in this diagram, the triple-tuned loop-type coil 154 of this modification is represented by the equivalent circuit 600 in which four series resonant circuits 41', 42, 43 and 44, each having inductors and capacitors, are connected in parallel. The resonance frequencies of the series resonant circuits 41', 42, 43 and 44 are $f_A$, $f_B$, $f_C$, and $f_D$, respectively.

Since the equivalent circuit 600 is adjusted so that the relation of Equation (25) should be satisfied, if a RF signal of the first resonance frequency $f_1$ is applied, the second series resonant circuit 42 operates as inductive reactance and can be regarded as an inductor 84 ($L_B'$). The first series resonant circuit 41', the third series resonant circuit 43 and the fourth series resonant circuit 44 operate as capacitive reactances, and can be regarded as capacitors 94, 95 and 96 ($C_A'$, $C_C'$, $C_D'$), respectively.

Figure 11B:
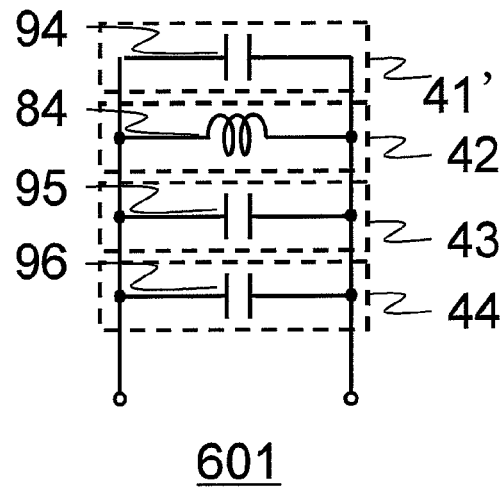

Therefore, at the first resonance frequency $f_1$, the equivalent circuit 600 is represented as a parallel resonant circuit 601 shown in FIG. 11B, in which the inductor 84, capacitors 94, 95 and 96 are connected in parallel. If the resonance frequency of the parallel resonant circuit 601 is adjusted to the first resonance frequency $f_1$ in this case, the equivalent circuit 600, i.e., the triple-tuned loop-type coil 154, resonates at the first resonance frequency $f_1$. Further, the relation of the resonance frequency $f_1$, capacitances $C_A'$, $C_C'$ and $C_D'$ of the capacitors 94, 95 and 96, and inductance $L_B'$ of the inductor 84 is represented as follows according to Equation (10).

$$f_1 = \frac{1}{2\pi \sqrt{L_B'(C_A' + C_C' + C_D')}} \tag{26}$$

Further, since the equivalent circuit 600 is adjusted so to satisfy the relation of Equation (25), if a RF signal of the second resonance frequency $f_2$ is applied, the first and second series resonant circuits 41' and 42 operate as inductive reactances and can be regarded as inductors 85 and 86 ($L_A''$, $L_B''$). The third and fourth series resonant circuits 43 and 44 operate as capacitive reactances, and can be regarded as capacitors 97 and 98 ($C_C''$, $C_D''$).

Figure 11C:
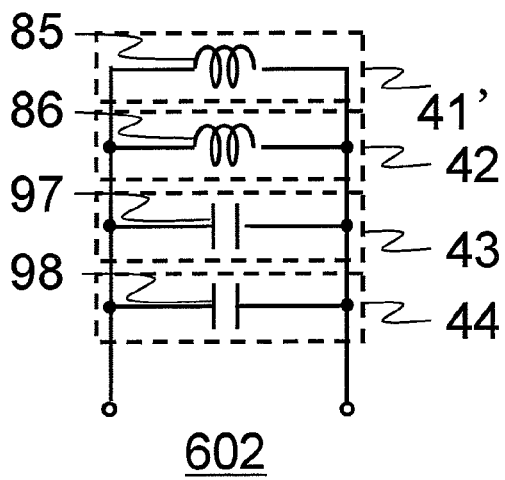

Therefore, at the second resonance frequency $f_2$, the equivalent circuit 600 is represented as a parallel resonant circuit 602 shown in FIG. 11C, in which the inductors 85 and 86 and capacitors 97 and 98 are connected in parallel. If the resonance frequency of the parallel resonant circuit 602 is adjusted to the second resonance frequency $f_2$ in this case, the equivalent circuit 600, i.e., the triple-tuned loop-type coil 154, resonates at the second resonance frequency $f_2$. Further, the relation of the second resonance frequency $f_2$, inductances $L_A''$ and $L_B''$ of the inductors 85 and 86, and capacitances $C_B''$ and $C_D''$ of the capacitors 97 and 98 constituting the parallel resonant circuit 602 is represented as follows according to Equation (10).

$$f_2 = \frac{1}{2\pi} \sqrt{\frac{L_A'' + L_B''}{L_A'' L_B'' (C_C'' + C_D'')}} \tag{27}$$

Further, since the equivalent circuit 600 is adjusted so as to satisfy the relation of Equation (25), if a RF signal of the third resonance frequency $f_3$ is applied, the first, second and third series resonant circuits 41', 42 and 43 operate as inductive reactances and can be regarded as inductors 87, 88 and 89 ($L_A'''$, $L_B'''$, $L_C'''$). Similarly, the fourth series resonant circuits 44 operates as capacitive reactance at the third resonance frequency $f_3$, and can be regarded as capacitor 99 ($C_D'''$).

Figure 11D:
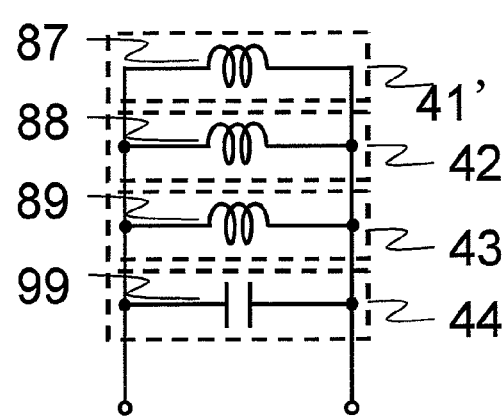

Therefore, at the third resonance frequency $f_3$, the equivalent circuit 600 is represented as a parallel resonant circuit 603 shown in FIG. 11D, in which the inductors 87, 88 and 89 and capacitor 99 are connected in parallel. If the resonance frequency of the parallel resonant circuit 603 is adjusted to the third resonance frequency $f_3$ in this case, the equivalent circuit 600, i.e., the triple-tuned loop-type coil 154, resonates at the third resonance frequency $f_3$. Further, the relation of the third resonance frequency $f_3$, inductances $L_A'''$, $L_B'''$ and $L_C'''$ of the inductors 87, 88 and 89, and capacitance $C_D'''$ of the capacitor 99 is represented as follows according to Equation (10).

$$f_3 = \frac{1}{2\pi} \sqrt{\frac{L_A''' L_B''' + L_B''' L_C''' + L_A''' L_C'''}{L_A''' L_B''' L_C''' C_D'''}} \tag{28}$$

When Equations (26), (27) and (28) are solved for $L_B$, $L_C$, $L_D$, $C_B$, $C_C$ and $C_D$, each of $L_B$, $L_C$, $L_D$, $C_B$, $C_C$ and $C_D$ is represented as a function including $f_B$, $f_C$ and $f_D$ as variables. By adjusting $f_B$, $f_C$ and $f_D$ so that they should satisfy the relation of Equation (25) and adjusting the inductances and capacitances so that they should be within the ranges giving low RF loss and enabling easy adjustment, i.e., 10 nH<($L_B$, $L_C$, $L_D$)<200 nH and 10 pF<($C_B$, $C_C$, $C_D$)<200 pF, the triple-tuned loop-type coil 154 resonates at the magnetic resonance frequencies of three kinds of elements ($f_1$, $f_2$, $f_3$), and can transmit and receive magnetic resonance signals.

As described above, the triple-tuned loop-type coil 154 can realize an RF coil which can transmit and receive magnetic resonance signals of three kinds of frequencies close to each other without using a capacitor having such a large capacitance that it should be accompanied by RF loss or an inductor having a small inductance causing difficulty in adjustment. Therefore, RF loss caused by inductor or capacitor can be markedly reduced, and reception sensitivity and transmission efficiency of an RF coil for magnetic resonance signals of three kinds of frequencies close to each other can be improved. Further, since any trap circuit which does not participate in signal detection of the RF coil is not included in the signal detection coil, uniformity of the sensitivity profile of the RF coil can be improved without disturbance of sensitivity profile of the RF coil by trap circuit. Furthermore, by disposing the loop coil 1 in contact with a subject 103, three kinds of magnetic resonance signals of which frequencies are close to one another from a portion near a contacting portion can be detected with high sensitivity.

In the above explanation, explained as an example is a case where the resonance frequencies of the first, second, third and fourth series resonant circuit 41, 42, 43 and 44 ($f_A$, $f_B$, $f_C$, $f_D$) are adjusted to satisfy the relation of Equation (25) so that the triple-tuned loop-type coil 154 should resonate at the first, second and third resonance frequencies ($f_1$, $f_2$, $f_3$) corresponding to the magnetic resonance frequencies of the first, second and third elements. However, the relation of the resonance frequencies of the series resonant circuits 41, 42 and 43 and the resonance frequencies of triple-tuned loop-type coil 154 is not limited to this. For example, the relation may be $f_B < f_1 < f_C < f_2 < f_A < f_3 < f_D$.

Further, the loop coil may be quadruple-tuned by further connecting a series resonant circuit, in which a capacitor and an inductor are connected in series, with the fourth series resonant circuit 44 in parallel. Furthermore, higher order tuning is also theoretically possible.

Second Embodiment

Hereafter, the second embodiment of the present invention will be explained. The configuration of the MRI apparatus based on this embodiment is basically the same as that of the first embodiment. In this embodiment, as the transmit and receive RF coil 116, a combination of two of double-tuned loop-type coils 150 of the first embodiment is used to realize the quadrature detection (QD) for improving irradiation efficiency and reception sensitivity of the transmit and receive RF coil. The configuration of this embodiment different from that of the first embodiment will be explained below.

FIG. 12A and FIG. 12B are diagrams for explaining the transmit and receive RF coil 116 of this embodiment, and FIG. 12A is a circuit diagram of the transmit and receive RF coil 116. In the diagram, the direction of the z axis in the coordinate 9 is the static magnetic field direction. As shown in this diagram, the transmit and receive RF coil 116 of this embodiment is provided with a first double-tuned loop-type coil 61 and a second double-tuned loop-type coil 62. The configuration of each of the double-tuned loop-type coils 61 and 62 is the same as that of the double-tuned loop-type coil 150 of the first embodiment. Further, the first double-tuned loop-type coil 61 and the second double-tuned loop-type coil 62 of this embodiment are each adjusted so as to resonate at the first resonance frequency $f_1$ and second resonance frequency $f_2$ ($>f_1$) like the double-tuned loop-type coil 150 of the first embodiment.

The first double-tuned loop-type coil 61 and the second double-tuned loop-type coil 62 of the transmit and receive RF coil 116 of this embodiment are disposed so that the loop planes 171 and 172 of the loop coil portions 1 and 2 should be parallel to the z axis. Further, the second double-tuned loop-type coil 62 is disposed at a position defined by rotating the first double-tuned loop-type coil 61 by 90 degrees around the z axis as a rotation axis.

FIG. 12B is a view of the transmit and receive RF coil 116 from the static magnetic field direction (z axis direction in the diagram). As shown in this diagram, in the transmit and receive RF coil 116 of this embodiment, the direction 63 of the magnetic field generated by the first double-tuned loop-type coil 61 and the direction 64 of the magnetic field generated by the second double-tuned loop-type coil 62 are perpendicular to each other. Therefore, the first double-tuned loop-type coil 61 and the second double-tuned loop-type coil 62 are not magnetically coupled, and they independently operate as RF coils for two kinds of magnetic resonance signals.

FIG. 13 is a block diagram for explaining connection of the first double-tuned loop-type coil 61 and the second double-tuned loop-type coil 62 of the transmit and receive RF coil 116 of this embodiment, a RF magnetic field generator 106 and a receiver 108. Output of the RF magnetic field generator 106 is inputted into a power divider 50 and divided into two. At this time, the distribution is performed so that the phases of two of the divided outputs should be perpendicular to each other. The outputs are inputted into a port 5 of the first double-tuned loop-type coil 61 and a port 6 of the second double-tuned loop-type coil 62 via baluns 46, respectively. Further, the outputs from two double-tuned loop-type coils 61 and 62 are inputted into the signal amplifiers 47 via baluns 46, and the outputs of the signal amplifiers 47 are inputted into a compositor (QD hybrid) 49 via phase shifters 48. Output of the compositor 49 is inputted into a receiver 108.

Operation of the transmit and receive RF coil 116 of this embodiment will be explained below. If a RF signal of the first resonance frequency $f_1$ or the second resonance frequency $f_2$ is transmitted by the RF magnetic field generator 106, the signal is distributed by the power divider 50 into two so that the phases of the signals should be perpendicular to each other, and the signals are applied to the port 5 and the port 6 via the baluns 46, respectively. The first double-tuned loop-type coil 61 and the second double-tuned loop-type coil 62 are adjusted so as to resonate at the first resonance frequency $f_1$ and second resonance frequency $f_2$, respectively, and therefore they irradiate the subject 103 with RF signals of the first resonance frequency $f_1$ or the second resonance frequency $f_2$ as a RF magnetic field. Since the phases of the RF magnetic fields irradiated by the first double-tuned loop-type coil 61 and the second double-tuned loop-type coil 62 are perpendicular to each other in this case, a rotating magnetic field is generated in the subject 103 around the z axis of the coordinates 9 as the revolution axis. As described above, the transmit and receive RF coil 116 of this embodiment realizes transmission of QD type.

Further, the first double-tuned loop-type coil 61 and the second double-tuned loop-type coil 62 each detect perpendicular signal components from the magnetic resonance signals of the first resonance frequency $f_1$ or the second resonance frequency $f_2$ generated from the subject 103. The detected signal components are amplified by the signal amplifiers 47, processed in the phase shifters 48, respectively, then synthesized by the compositor 49 and sent to the receiver 108. As described above, the transmit and receive RF coil 116 of this embodiment realizes reception of QD type.

As explained above, since the transmit and receive RF coil of this embodiment realizes QD, it can highly efficiently irradiate the subject 103 with a RF magnetic field, and can detect two kinds of magnetic resonance signals with higher sensitivity, in addition to the effect brought by the double-tuned loop-type coil 150 of the first embodiment.

This embodiment is explained above by exemplifying a case where two of the double-tuned loop-type coils 150 of the first embodiment are combined in order to realize QD. However, coils to be combined in order to realize QD are not limited to these. Any combination of two coils which can be disposed so that the magnetic fields generated by the coils should be perpendicular to each other may be used. For example, two of saddle-type coils may be disposed so that one of them should be rotationally shifted by 90 degrees from the other around the z axis as the rotation axis, or a solenoid-type coil and a saddle-type coil may be disposed so that directions of the cylinders formed by them should be the same.

Third Embodiment

Hereafter, the third embodiment of the present invention will be explained. The configuration of the MRI apparatus of this embodiment is basically the same as that of the first embodiment. In this embodiment, a transmit RF coil 116*a* and a receive RF coil 116*b* are independently provided instead of the transmit and receive RF coil 116 of the first embodiment. Here, explanation will be made by exemplifying a case where a double-tuned birdcage RF coil having a birdcage shape is used as the transmit RF coil 116*a*, and a double-tuned loop-type coil having a loop coil shape is used for the receive RF coil 116*b*. Hereafter, the embodiment will be explained by emphasizing the configuration different from that of the first embodiment.

FIG. 14 is a block diagram for explaining connection of the RF coil of this embodiment, a RF magnetic field generator 106 and a receiver 108. As shown in this diagram, the RF coil of this embodiment is provided with a double-tuned birdcage RF coil 70, which is the transmit RF coil 116*a*, a double-tuned loop-type RF coil 71, which is a receive RF coil 116b, magnetic coupling preventing circuits 54 and 68 for preventing magnetic coupling of the double-tuned birdcage RF coil 70 and the double-tuned loop-type coil 71, a magnetic coupling preventing circuit driver 115 for driving the magnetic coupling preventing circuits 54 and 68, and a power divider 50 which divides output of the RF magnetic field generator 106. In this embodiment, the magnetic coupling preventing circuit 54 is serially inserted into the loop portion of the double-tuned birdcage RF coil 70, and the magnetic coupling preventing circuit 68 is serially inserted into the double-tuned loop-type coil 71.

The double-tuned loop-type coil 71 of this embodiment is constituted so that the equivalent circuit thereof should be equivalent to the equivalent circuit 500 of the first embodiment, and it is adjusted so as to resonate at the first resonance frequency $f_1$ and second resonance frequency $f_2$. The double-tuned birdcage RF coil 70 is constituted with a circuit of conventional type, and is adjusted so as to resonate at the first resonance frequency $f_1$ and the second resonance frequency $f_2$.

Output of the RF magnetic field generator 106, which generates a RF magnetic field of the first resonance frequency $f_1$, is inputted into a power divider 50 and is divided into two, and the outputs are inputted into pickup coils 65 via baluns 46. Output of RF magnetic field generator 106, which generates a RF magnetic field having the second resonance frequency $f_2$, is inputted into the power divider 50 and divided into two, and the outputs are inputted into pickup coils 66 via baluns 46. The pickup coils 65 and 66 are disposed so as to transmit RF signals of the first resonance frequency $f_1$ and the second resonance frequency $f_2$ to the double-tuned birdcage RF coil 70, respectively. The double-tuned birdcage RF coil 70 is provided with two or more magnetic coupling preventing circuits 54. Two or more signal wires for control 51 are connected from a magnetic coupling preventing circuit driver 115 to the magnetic coupling preventing circuits 54. The double-tuned loop-type coil 71 is disposed inside of the double-tuned birdcage RF coil 70 so as to be disposed at a position close to the subject 103. Output of the double-tuned loop-type coil 71 is inputted into the signal amplifier 47 via the baluns 46, and inputted into the receiver 108 from the signal amplifier 47. Two or more signal wires for control 51 are connected from the magnetic coupling preventing circuit driver 115 to the magnetic coupling preventing circuit 68.

FIG. 15A is a diagram for explaining the configuration and arrangement of the double-tuned birdcage RF coil 70 of this embodiment. As shown in this diagram, the double-tuned birdcage RF coil 70 of this embodiment is provided with two loop conductive materials 8 disposed so that both loop planes are faced each other having a common axis perpendicular to the loop planes, and connected with two or more linear conductive materials 7 (eight conductive materials are used in FIG. 15A as an example) parallel to the direction of the axis perpendicular to the loop planes of the loop conductive materials 8. Two or more magnetic coupling preventing circuits 54 are inserted into each loop conductive material 8. Further, the double-tuned birdcage RF coil 70 is disposed so that the central axis of the cylinder shape formed by it should be parallel to the z axis direction.

FIG. 15B is a diagram for explaining the configuration of the magnetic coupling preventing circuit 54 of this embodiment. As shown in this diagram, in the magnetic coupling preventing circuit 54 of this embodiment, an inductor 18 and a series circuit having a capacitor 26 and another capacitor 27 connected in series are connected in parallel. A circuit having a PIN diode 30 and an inductor 16 connected in series is connected to the capacitor 26 in parallel, and a circuit having a PIN diode 31 and an inductor 17 connected in series is connected to the capacitor 27 in parallel. The PIN diodes have a characteristic that they becomes substantially conductive when a direct current higher than a certain level flows along the forward direction of the diodes, and turning-on and -off of the diodes can be controlled with a direct current. Output terminals of the magnetic coupling preventing circuit driver 115 are connected to the junction point of the PIN diode 30 and the inductor 16 and the junction point of the PIN diode 31 and the inductor 17. By controlling tuning-on and -off of the PIN diodes 30 and 31 of the magnetic coupling preventing circuit 54 with a control current 51 from the magnetic coupling preventing circuit driver 115, the double-tuned birdcage coil 70 is operated as the transmit RF coil 116a at the time of RF signal transmission, and the double-tuned birdcage coil 70 is made to have high impedance to prevent interference with the receive RF coil 116b (double-tuned loop-type coil 71) at the time of RF signal reception. The details of this operation will be described later.

FIG. 16A is a diagram for explaining the configuration of the double-tuned loop-type coil 71. In the diagram, the direction of the z axis in the coordinate 9 corresponds to the static magnetic field direction. The double-tuned loop-type coil 71 of this embodiment is basically the same as the double-tuned loop-type coil 150 of the first embodiment, and is further provided with a magnetic coupling preventing circuit 68 in the loop coil 1. In the magnetic coupling preventing circuit 68 shown in FIG. 16B, a capacitor 26 and another capacitor 27 are connected in series. A circuit having a PIN diode 30 and an inductor 16 connected in series is connected to the capacitor 26 in parallel, and a circuit having a PIN diode 31 and an inductor 17 connected in series is connected to the capacitor 27 in parallel. The PIN diodes have a characteristic that they becomes substantially conductive when a direct current higher than a certain level flows along the forward direction of the diodes, and on/off of the diodes can be controlled with a direct current. Output terminals of the magnetic coupling preventing circuit driver 115 are connected to the junction point of the PIN diode 30 and the inductor 16 and the junction point of the PIN diode 31 and the inductor 17. On/off is controlled with a control current 51 from the magnetic coupling preventing circuit driver 115, so that the double-tuned loop-type coil 71 should operate as the receive RF coil 116b at the time of RF signal reception, and the double-tuned loop-type coil 71 should be made to have high impedance to prevent interference with the transmit RF coil 116a (double-tuned birdcage coil 70) at the time of RF signal transmission. The details of this operation will be described later.

Immediately before a RF magnetic field having the resonance frequency $f_1$ or $f_2$ is applied from the RF magnetic field generator 106 to the double-tuned birdcage coil 70, the magnetic coupling preventing circuit driver 115 sets the value of the control current 51 to be flown through the PIN diode 30 of the double-tuned birdcage coil 70 to be 0, and applies a direct control current 51 so that the PIN diode 31 of the double-tuned loop-type coil 71 should be turned on.

By applying the control current 51 to the double-tuned loop-type coil 71, the PIN diode 31 is turned on, the parallel resonant circuit 55 having the capacitor 26 and the inductor 16 resonates at the resonance frequency $f_1$, and the parallel resonant circuit 56 having the capacitor 27 and the inductor 17 resonates at the resonance frequency $f_2$. As a result, impedance of the double-tuned loop-type coil 71 becomes extremely high, thus current hardly flows through the double-tuned loop-type coil 71, and magnetic field is hardly generated, either.

On the other hand, since the value of the control current 51 which flows through the diode 30 becomes 0 in the double-tuned birdcage coil 70, all the diodes 30 are turned off, the parallel resonant circuit 54 comes to be a circuit equivalent to a parallel circuit including the circuit having two of the capacitors 26 and 27 connected in series and the inductor 18 connected in parallel (trap circuit), and the double-tuned birdcage coil 70 resonates at the resonance frequency $f_1$ and the resonance frequency $f_2$.

Therefore, magnetic coupling of the double-tuned birdcage coil 70 and the double-tuned loop-type coil 71 is eliminated, and the double-tuned birdcage coil 70 can irradiate a RF magnetic field of the resonance frequency $f_1$ or $f_2$ on the subject 103 without shift of the resonance frequency or fall of the Q value of the coil due to magnetic coupling.

When magnetic resonance signals emitted from the subject 103 are received after applying the RF magnetic field, the magnetic coupling preventing circuit driver 115 applies the control current 51 so that the diode 30 of the double-tuned birdcage coil 70 should be turned on, and sets the value of the control current 51 flown through the diode 31 of the double-tuned loop-type coil 71 to be 0.

When the control current 51 is applied to the double-tuned birdcage coil 70, the diode 30 is turned on, the parallel resonant circuit 130 having the capacitor 26 and the inductor 16 resonates at the resonance frequency $f_1$, and the parallel resonant circuit 131 having the capacitor 27 and the inductor 17 resonates at the resonance frequency $f_2$. As a result, impedance of the double-tuned birdcage coil 70 becomes extremely high at the resonance frequencies $f_1$ and $f_2$, current hardly flows in the double-tuned birdcage coil 70, and magnetic field is hardly generated, either.

On the other hand, since the value of the control current 51 which flows through the diode 31 becomes 0 in the double-tuned loop-type coil 71, the diode 31 is turned off, and the connection between the inductor 16 and the capacitor 26 and the connection between the inductor 17 and the capacitor 27 are cut off. As a result, the double-tuned loop-type coil 71 becomes a circuit equivalent to the double-tuned loop-type coil 150 of the first embodiment, and operates as a coil which resonates at the resonance frequencies $f_1$ and $f_2$.

Therefore, when two kinds of magnetic resonance signals corresponding to the resonance frequencies $f_1$ and $f_2$ emitted from the subject 103 are received, magnetic coupling of the double-tuned birdcage coil 70 and the double-tuned loop-type coil 71 is eliminated, and the double-tuned loop-type coil 71 receives magnetic resonance signals corresponding to the resonance frequency $f_1$ or $f_2$ with high sensitivity without shift of the resonance frequency or fall of the Q value of the coil due to magnetic coupling.

As described above, according to this embodiment, magnetic coupling of the double-tuned birdcage RF coil 70 and the double-tuned loop-type coil 71 which are tuned to two kinds of magnetic resonance frequencies close to each other can be prevented at the time of application of a RF magnetic field and reception of magnetic resonance signals. As a result, the double-tuned birdcage RF coil 70 can transmit signals of a uniform RF magnetic field having two kinds of magnetic resonance frequencies close to each other, and the double-tuned loop-type coil 71 can simultaneously receive magnetic resonance signals of two kinds of frequencies close to each other with high sensitivity.

Therefore, according to this embodiment, the shape of the transmit RF coil 116a and the shape of receive RF coil 116b can be independently chosen. According to this embodiment, in addition to the effect of the first embodiment, the effect brought by the shape of RF coil 116 can be obtained. For example, by using a double-tuned birdcage coil 70 showing high uniformity of irradiation distribution as the transmit RF coil 116a and selecting the shape of the receive RF coil 116b according to the shape and size of the subject 103, magnetic resonance images optimized for each individual subject 103 can be obtained. Of course, the transmit RF coil 116a is not limited to the double-tuned birdcage RF coil 70.

In this embodiment, a double-tuned array coil 72 such as shown in FIG. 17 can be used as the receive RF coil 116b. The double-tuned array coil 72 is made up of a plurality of partially overlapping loop coils 1 (4 coils in FIG. 17). The positions of the overlapping portions of the adjacent loop coils 1 are adjusted so that magnetic coupling of the loop coils 1 should be eliminated. By using the double-tuned array coil 72, it becomes possible to image a region wider than that can be imaged by using one double-tuned receive coil 71. Therefore, it becomes possible to, for example, simultaneously receive magnetic resonance signals of two kinds of frequencies close to each other with high sensitivity for the whole trunks of a test person (patient) as the subject 103.

In addition, the configuration of the magnetic coupling preventing circuit 68 is not limited to that mentioned above. For example, it may have the configuration shown in FIG. 16C. The magnetic coupling preventing circuit 69 shown in FIG. 16C is provided with a cross diode 34 having a combination of two PIN diodes of which polarities are inverse each other instead of the magnetic coupling preventing circuit driver 115 and the PIN diode driven thereby provided in the magnetic coupling circuit 68. The capacitor 26 and the capacitor 27 are connected in series. A circuit having the cross diode 34 and the inductor 16 connected in series is connected to the capacitor 26 in parallel, and a circuit having the cross diode 34 and the inductor 17 connected in series is connected to the capacitor 27 in parallel.

Immediately before a RF magnetic field having the resonance frequency $f_1$ or $f_2$ is applied from the RF magnetic field generator 106 to the double-tuned birdcage coil 70, the magnetic coupling preventing circuit driver 115 sets the value of the control current 51 to be flown through the PIN diode 30 of the double-tuned birdcage coil 70 to be 0.

Since the value of the control current 51 which flows through the diode 30 becomes 0 in the double-tuned birdcage coil 70, all the diodes 30 are turned off, the parallel resonant circuit 54 comes to be a circuit equivalent to the parallel circuit including the circuit having two of the capacitors 26 and 27 connected in series and the inductor 18 connected in parallel (trap circuit), and the double-tuned birdcage coil 70 resonates at the resonance frequency $f_1$ and the resonance frequency $f_2$.

On the other hand, intense electromotive force is generated by magnetic coupling in the double-tuned loop-type coil 71 to which the RF magnetic field is applied, and the cross diode 34 is turned on. The parallel resonant circuit 57 having the capacitor 26 and the inductor 16 resonates at the resonance frequency $f_1$, and the parallel resonant circuit 58 comprising the capacitor 27 and the inductor 17 resonates at the resonance frequency $f_2$. As a result, impedance of the double-tuned loop-type coil 71 becomes extremely high, thus current hardly flows through the double-tuned loop-type coil 71, and magnetic field is hardly generated, either.

Therefore, magnetic coupling of the double-tuned birdcage coil 70 and the double-tuned loop-type coil 71 is eliminated, and the double-tuned birdcage coil 70 can irradiate a RF magnetic field of the resonance frequency $f_1$ or $f_2$ on the subject 103 without shift of the resonance frequency or fall of the Q value of the coil due to magnetic coupling.

When magnetic resonance signals emitted from the subject 103 are received after applying the RF magnetic field, the magnetic coupling preventing circuit driver 115 applies the control current 51 to be flown in the PIN diode 30 of the double-tuned birdcage coil 70.

When the control current 51 is applied to the double-tuned birdcage coil 70, the diode 30 is turned on, the parallel resonant circuit 130 having the capacitor 26 and the inductor 16 resonates at the resonance frequency $f_1$, and the parallel resonant circuit 131 having the capacitor 27 and the inductor 17 resonates at the resonance frequency $f_2$. As a result, impedance of the double-tuned birdcage coil 70 becomes extremely high at the resonance frequencies $f_1$ and $f_2$, current hardly flows in the double-tuned birdcage coil 70, and magnetic field is hardly generated, either.

On the other hand, the double-tuned loop-type coil 71 receives magnetic resonance signals generated by the subject 103. However, since the magnetic resonance signals have extremely small currents, the cross diode 34 is turned off, and is not connected to the inductor 16 and the inductor 17. As a result, the double-tuned loop-type coil 71 becomes a circuit equivalent to the double-tuned loop-type coil 150 of the first embodiment, and operates as a coil which resonates at the resonance frequencies $f_1$ and $f_2$.

As described above, when the magnetic coupling preventing circuit 69 is used, magnetic coupling of double-tuned birdcage transmit RF coil 70 and the double-tuned receive coil 71 can be prevented without using the magnetic coupling preventing circuit driver 115 in the double-tuned receive coil. Therefore, in addition to the effect obtained in the case of using the magnetic coupling preventing circuit 68, an effect that the configuration can further be simplified can also be obtained.

Fourth Embodiment

Hereafter, the fourth embodiment of the present invention will be explained. The configuration of the MRI apparatus based on this embodiment is basically the same as those of the aforementioned embodiments. In this embodiment, as the transmit and receive RF coil 116, a combination of two of double-tuned loop-type coils 150 of the first embodiment is used as in the second embodiment. In this embodiment, however, two of the double-tuned loop-type coils are disposed so that the loop planes of the loop coils should be in the same plane. The configuration of this embodiment different from that of the second embodiment will be explained below.

FIG. 18 is a diagram for explaining a transmit and receive RF coil 116 of this embodiment. In the diagram, the direction of the z axis in the coordinate 9 is the static magnetic field direction. As shown in this diagram, the transmit and receive RF coil 116 of this embodiment is provided with a first double-tuned loop-type coil 59 and a second double-tuned loop-type coil 60. The configurations of the double-tuned loop-type coils 59 and 60 are the same as that of the double-tuned loop-type coil 150 of the first embodiment. Furthermore, as in the double-tuned loop-type coil 150 of the first embodiment, the first double-tuned loop-type coil 59 and the second double-tuned loop-type coil 60 of this embodiment are adjusted so that they should resonate at two different resonance frequencies.

The first double-tuned loop-type coil 59 of the transmit and receive RF coil 116 of this embodiment is disposed so that the loop plane 173 thereof should be in a plane parallel to the xz plane of the coordinate 9. The second double-tuned loop-type coil 60 is disposed so that the loop plane 174 thereof should be in the same plane as the loop plane 173 of the first double-tuned loop-type coil 59. The second double-tuned loop-type coil 60 is disposed inside the first double-tuned loop-type coil 59, and it is adjusted so as to resonate at two resonance frequencies which are different from those of the first double-tuned loop-type coil 59. A parallel resonant circuit 35 and a parallel resonant circuit 36, which are adjusted for the two frequencies to which the second double-tuned loop-type coil 60 is tuned, respectively, are inserted into the loop coil of the first double-tuned loop-type coil 59 in series in order to prevent magnetic coupling thereof with the second double-tuned loop-type coil 60. On the other hand, a parallel resonant circuit 37 and a parallel resonant circuit 38, which are adjusted for the two frequencies to which the first double-tuned loop-type coil 59 is tuned, respectively, are inserted into the loop coil of the second double-tuned loop-type coil 60 in series in order to prevent magnetic coupling thereof with the first double-tuned loop-type coil 59.

The operation of the transmit and receive RF coil 116 of this embodiment will be explained below. Explained here as an example is a case where inductors 11, 12 and 13 and capacitors 21, 22 and 23 of the first double-tuned loop-type coil 59 are adjusted so as to resonate at the frequencies of $^1$H and $^{19}$F (they are defined to be the first resonance frequency $f_1$ and the second resonance frequency $f_2$, respectively), and inductors 81, 82 and 83 and capacitors 91, 92 and 93 of the second double-tuned loop-type coil 60 are adjusted so as to resonate at the frequencies of $^{23}$Na (sodium) and $^{13}$C (carbon) (they are defined to be the third resonance frequency $f_3$ and the fourth resonance frequency $f_4$, respectively).

When a signal of the first resonance frequency $f_1$ is transmitted to the first double-tuned loop-type coil 59, or when the first double-tuned loop-type coil 59 receives a signal of the first resonance frequency $f_1$ (hereafter transmission and reception are collectively referred to "to be tuned"), since the parallel resonant circuit 37 inserted into the loop coil of the second double-tuned loop-type coil 60 in series is adjusted so as to resonate at the first resonance frequency $f_1$, the impedance thereof becomes extremely high. On the other hand, when the first double-tuned loop-type coil 59 is tuned to the second resonance frequency $f_2$, since the parallel resonant circuit 38 inserted into the loop of the second double-tuned loop-type coil 60 in series is adjusted so as to resonate at the second resonance frequency $f_2$, the impedance thereof becomes extremely high. Therefore, even when the first double-tuned loop-type coil 59 is tuned to whichever frequency ($f_1$ or $f_2$), magnetic coupling of the first double-tuned loop-type coil 59 and the second double-tuned loop-type coil 60 is eliminated, and thus the first double-tuned loop-type coil 59 can irradiate a RF magnetic field of the first or second resonance frequency ($f_1$ or $f_2$) on the subject 103 and detect signals from the subject 103 without shift of the resonance frequency or fall of the Q value of the coil due to magnetic coupling.

Similarly, when the second double-tuned loop-type coil 60 is tuned to the third resonance frequency $f_3$, since the parallel resonant circuit 35 inserted into the loop of the first double-tuned loop-type coil 59 in series is adjusted so as to resonate at the third resonance frequency $f_3$, the impedance thereof becomes extremely high. On the other hand, when the second double-tuned loop-type coil 60 is tuned to the fourth resonance frequency $f_4$, since the parallel resonant circuit 36 inserted into the loop of the first double-tuned loop-type coil 59 in series is adjusted so as to resonate at the fourth resonance frequency, the impedance thereof becomes extremely high. Therefore, even when the second double-tuned loop-type coil 60 is tuned to whichever frequency ($f_3$ or $f_4$), magnetic coupling of the first double-tuned loop-type coil 59 and the second double-tuned loop-type coil 60 is eliminated, and thus the second double-tuned loop-type coil 60 can irradiate a RF magnetic field of the third or fourth resonance frequency ($f_3$ or $f_4$) on the subject 103 and detect signals from the subject without shift of the resonance frequency or decrease of the Q value of the coil due to magnetic coupling.

As described above, according to this embodiment, magnetic coupling of the double-tuned loop-type coil 59 and the double-tuned loop-type coil 60, which are tuned to two magnetic resonance frequencies close to each other, respectively, can be prevented at the time of application of a RF magnetic field and reception of magnetic resonance signals. Therefore, according to this embodiment, it becomes possible to obtain signals of four resonance frequencies, and in addition to the effect of the first embodiment, imaging of more various nuclides becomes possible without exchanging the coil.

In addition, in the aforementioned embodiments, the second series resonant circuit 42, the third series resonant circuit 43 and the signal processing circuit 45 may be covered with an electric wave shield 52. The configuration and operation in the case of covering with the electric wave shield 52 will be explained below for the case of the double-tuned loop-type coil 150 of the first embodiment as an example.

FIG. 19 is a diagram for explaining the case of applying the electric wave shield 52 to the double-tuned loop-type coil of the first embodiment. As shown in this diagram, in this case, the second series resonant circuit 42, the third series resonant circuit 43 and the signal processing circuit 45 of the double-tuned loop-type coil 150 are covered with the electric wave shield 52. Further, the electric wave shield 52 is grounded on the earth. The signal processing circuit 45 is connected to the signal wire 53.

Because the second series resonant circuit 42, the third series resonant circuit 43 and the signal processing circuit 45 are covered with the electric wave shield 52, influence of the RF magnetic field generated by the loops of the portions of the second series resonant circuit 42, the third series resonant circuit 43 and the signal processing circuit 45 on the RF magnetic field generated by the loop coil 1 can be reduced. Therefore, according to this embodiment, a RF magnetic field can be irradiated on the subject 103 with suppressing turbulence of the magnetic field generated by the loop coil 1. Further, magnetic coupling of the second series resonant circuit 42, the third series resonant circuit 43 and the signal processing circuit 45 with the subject 103 can be prevented by the electric wave shield 52. That is, according to this embodiment, influence of external noises can be reduced, and loss due to magnetic coupling can be reduced.

What is claimed is:

1. A RF coil for magnetic resonance imaging apparatus, tuned to at least two different resonant frequencies, comprising:
a first series resonant circuit comprising a loop coil made of a conductive material and one or more capacitors inserted into the loop coil,
a first circuit connected in parallel to the first series resonant circuit, and
a signal processing circuit connected in parallel to the first circuit, and having two or more different resonance frequencies,
wherein:
the first circuit comprises one or more capacitors and one or more inductors, and is connected in parallel with at least two series resonant circuits each having different resonance frequencies, the resonance frequencies of the at least two series resonant circuits also differ from resonance frequency of the first series resonant circuit, and
each of the resonance frequencies of the RF coil are adjusted so as to be between the resonance frequency of the first series resonant circuit and the resonance frequencies of the at least two series resonant circuits.

2. A RF coil for magnetic resonance imaging apparatus, tuned to at least two different resonant frequencies, comprising:
a first series resonant circuit comprising a loop coil made of a conductive material and one or more capacitors inserted into the loop coil,
a second series resonant circuit comprising one or more capacitors and one or more inductors connected in series and connected in parallel to the first series resonant circuit,
a third series resonant circuit comprising one or more capacitors and one or more inductors connected in series and connected in parallel to the second series resonant circuit, and
a signal processing circuit connected in parallel to the third circuit,
wherein:
resonance frequency $f_A$ of the first series resonant circuit, resonance frequency $f_B$ of the second series resonant circuit, resonance frequency $f_C$ of the third series resonant circuit, first resonance frequency $f_1$ and second resonance frequency $f_2$ of the RF coil are adjusted so as to satisfy a relation of $f_B<f_1<f_A<f_2<f_C$.

3. The RF coil according to claim 2, wherein the loop coil comprises two loops of a conductive material disposed in a shape of cylindrical side so as to face each other in a saddle shape and connected so that directions of magnetic fields generated by the loops of a conductive material should be the same.

4. The RF coil according to claim 2, wherein the loop coil comprises two loops of a conductive material adjacently disposed in the same plane in a butterfly shape and connected so that directions of magnetic fields generated by the loops of a conductive material should be inverse to each other.

5. The RF coil according to claim 2, wherein the loop coil has a solenoid shape.

6. The RF coil according to claim 2, which further comprises:
a fourth series resonant circuit connected in parallel between the third series resonant circuit and the signal processing circuit, wherein:
the resonance frequencies $f_A$, $f_B$, $f_C$, $f_1$, $f_2$, resonance frequency $f_D$ of the fourth series resonant circuit, and third resonance frequency $f_3$ ($>f_2>f_1$) of the RF coil are adjusted so as to satisfy a relation of $f_B<f_1<f_A<f_2<f_C<f_3<f_D$ or $f_B<f_1<f_C<f_2<f_A<f_3<f_D$.

7. The RF coil according to claim 2, wherein portions of the coil other than that of the first series resonant circuit are provided with electric wave shield.

8. The RF coil according to claim 2, wherein the first resonance frequency corresponds to 70% or more of the second resonance frequency.

9. A RF coil system for magnetic resonance imaging apparatus comprising:
a first RF coil, and a second RF coil, wherein:
the first RF coil is the RF coil according to claim 2,
the second RF coil is the RF coil according to claim 2, the coils are disposed so that direction of magnetic field generated by the second RF coil should be perpendicular to direction of magnetic field generated by the first RF coil, and a phase of signal applied to the second RF coil is different from a phase of signals applied to the first RF coil by 90 degrees.

10. A RF coil system for magnetic resonance imaging apparatus comprising:

an array coil comprising two or more of the RF coils according to claim 2 disposed so that the loop coil portions should partially overlap.

11. A RF coil system for magnetic resonance imaging apparatus comprising:

a magnetic field transmit RF coil, a magnetic field receive RF coil, and a magnetic coupling preventing means, wherein:

the magnetic field transmit RF coil comprises the RF coil that operate at different resonance frequencies, the magnetic field receive RF coil is the RF coil according to claim 2, and the magnetic coupling preventing means makes the magnetic field receive coil to be in an open state at a time of transmission of signals of the first resonance frequency and the second resonance frequency, and makes the magnetic field transmit coil to be in an open state at a time of reception of signals of the first resonance frequency and the second resonance frequency.

12. The RF coil system according to claim 11, wherein the magnetic coupling preventing means comprises a diode, and the diode is turned on and off with an external control signal.

13. The RF coil system according to claim 11, wherein the magnetic coupling preventing means comprises a cross diode comprising two diodes connected in reverse directions.

14. A RF coil system for magnetic resonance imaging apparatus comprising:

a first magnetic field transmit and receive RF coil, a second magnetic field transmit and receive RF coil, and a magnetic coupling preventing means, wherein:

the first magnetic field transmit and receive RF coil and the second magnetic field transmit and receive RF coil are the RF coils according to claim 2, two of the resonance frequencies of the second magnetic field transmit and receive RF coil are adjusted so as to be different from two of the resonance frequencies of the first magnetic field transmit and receive RF coil, and the magnetic coupling preventing means makes the second magnetic field transmit and receive RF coil to be in an open state at a time of transmission and reception of signals of two of the resonance frequencies of the first magnetic field transmit and receive RF coil, and makes the first magnetic field transmit and receive RF coil to be in an open state at a time of transmission and reception of signals of two of the resonance frequencies of the second magnetic field transmit and receive RF coil.

15. A magnetic resonance imaging apparatus comprising a static magnetic field generating means for generating a static magnetic field, a gradient magnetic field generating means for generating a gradient magnetic field, a RF magnetic field generating means for generating a RF magnetic field, a transmit and receive RF coil for applying the RF magnetic field to a subject and receiving magnetic resonance signals from the subject, and a control means for controlling the gradient magnetic field generating means, the RF magnetic field generating means and the transmit and receive RF coil, wherein the transmit and receive RF coil is the RE coil according to claim 2.

16. A magnetic resonance imaging apparatus comprising a static magnetic field generating means for generating a static magnetic field, a gradient magnetic field generating means for generating a gradient magnetic field, a RF magnetic field generating means for generating a RF magnetic field, a transmit coil for applying the RF magnetic field to a subject, a receive coil for receiving magnetic resonance signals from the subject, and a control means for controlling the gradient magnetic field generating means, the RE magnetic field generating means, the transmit coil and the receive coil, wherein the transmit coil is the RF coil according to claim 2.

17. A magnetic resonance imaging apparatus comprising a static magnetic field generating means for generating a static magnetic field, a gradient magnetic field generating means for generating a gradient magnetic field, a RF magnetic field generating means for generating a RF magnetic field, a transmit coil for applying the RF magnetic field to a subject, a receive coil for receiving magnetic resonance signals from the subject, and a control means for controlling the gradient magnetic field generating means, the RF magnetic field generating means, the transmit coil and the receive coil, wherein the receive coil is the RF coil according to claim 2.

* * * * *